US011356629B2

(12) United States Patent
Tsuchiya

(10) Patent No.: US 11,356,629 B2
(45) Date of Patent: *Jun. 7, 2022

(54) ELECTRONIC APPARATUS, METHOD FOR CONTROLLING ELECTRONIC APPARATUS, AND CONTROL PROGRAM

(71) Applicant: NIKON CORPORATION, Tokyo (JP)

(72) Inventor: Satoshi Tsuchiya, Tokyo (JP)

(73) Assignee: NIKON CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/986,644

(22) Filed: Aug. 6, 2020

(65) Prior Publication Data

US 2020/0366862 A1    Nov. 19, 2020

Related U.S. Application Data

(63) Continuation of application No. 16/395,351, filed on Apr. 26, 2019, now Pat. No. 10,805,566, which is a
(Continued)

(30) Foreign Application Priority Data

Aug. 12, 2013 (JP) .............................. JP2013-167308

(51) Int. Cl.
*H04N 5/376* (2011.01)
*H01L 27/146* (2006.01)
(Continued)

(52) U.S. Cl.
CPC ....... *H04N 5/3765* (2013.01); *H01L 27/1464* (2013.01); *H01L 27/14609* (2013.01);
(Continued)

(58) Field of Classification Search
CPC ................. H04N 5/3765; H04N 5/369; H04N 5/232935; H04N 5/35554; H04N 5/379;
(Continued)

(56) References Cited

U.S. PATENT DOCUMENTS 8,508,639 B2    8/2013  Mabuchi et al.
9,060,134 B2 *  6/2015  Mitsunaga ........... H04N 5/3535
(Continued)

FOREIGN PATENT DOCUMENTS

JP    H09-200617 A    7/1997
JP    2004-282227 A   10/2004
(Continued)

OTHER PUBLICATIONS

Aug. 18, 2020 Office Action issued in Japanese Patent Application No. 2018-196396.
(Continued)

*Primary Examiner* — Ahmed A Berhan
(74) *Attorney, Agent, or Firm* — Oliff PLC

(57) ABSTRACT

To divide an image capture region into multiple regions for which different image capture conditions are set and to generate multiple moving images corresponding to the multiple regions. An electronic apparatus includes an image sensor that captures first and second moving images in first and second regions of an image capture region on different image capture conditions, the second region differing from the first region, and a moving image generation unit that generates the first and second moving images captured in the first and second regions.

18 Claims, 17 Drawing Sheets

Related U.S. Application Data continuation of application No. 14/910,428, filed as application No. PCT/JP2014/070874 on Aug. 7, 2014, now Pat. No. 10,321,083.

(51) Int. Cl.

| | | |
|---|---|---|
| *H04N 5/225* | (2006.01) | |
| *H04N 5/232* | (2006.01) | |
| *H04N 5/345* | (2011.01) | |
| *H04N 5/351* | (2011.01) | |
| *H04N 5/353* | (2011.01) | |
| *H04N 5/355* | (2011.01) | |
| *H04N 5/369* | (2011.01) | |
| *H04N 9/04* | (2006.01) | |
| *H04N 5/3745* | (2011.01) | |

(52) U.S. Cl.
CPC ..... *H01L 27/14634* (2013.01); *H04N 5/2253* (2013.01); *H04N 5/232935* (2018.08); *H04N 5/345* (2013.01); *H04N 5/351* (2013.01); *H04N 5/3535* (2013.01); *H04N 5/35554* (2013.01); *H04N 5/369* (2013.01); *H04N 5/379* (2018.08); *H04N 5/3745* (2013.01); *H01L 27/14621* (2013.01); *H01L 27/14627* (2013.01); *H04N 9/04557* (2018.08)

(58) Field of Classification Search
CPC .... H04N 5/345; H04N 5/3535; H04N 5/2253; H04N 5/351; H04N 5/3745; H04N 9/04557; H01L 27/14609; H01L 27/14634; H01L 27/1464; H01L 27/14621; H01L 27/14627
See application file for complete search history.

(56) References Cited

U.S. PATENT DOCUMENTS

| | | |
|---|---|---|
| 2004/0100570 A1 | 5/2004 | Shizukuishi |
| 2006/0023109 A1 | 2/2006 | Mabuchi et al. |
| 2007/0195182 A1 | 8/2007 | Ito |
| 2007/0222877 A1 | 9/2007 | Kurane |
| 2007/0257185 A1* | 11/2007 | Asaba ............... H01L 27/14609 250/208.1 |
| 2008/0024631 A1 | 1/2008 | Tani et al. |
| 2010/0002940 A1 | 1/2010 | Aoki et al. |
| 2010/0231738 A1 | 9/2010 | Border et al. |
| 2011/0234881 A1 | 9/2011 | Wakabayashi et al. |
| 2012/0199930 A1 | 8/2012 | Hayashi |
| 2013/0009224 A1 | 1/2013 | Ohri |
| 2013/0033632 A1 | 2/2013 | Kishi |
| 2013/0093923 A1 | 4/2013 | Imagawa et al. |
| 2013/0308044 A1 | 11/2013 | Mitsunaga |
| 2014/0145288 A1 | 5/2014 | Hayashi |
| 2014/0239433 A1 | 8/2014 | Wakano |
| 2015/0077590 A1 | 3/2015 | Kuriyama et al. |
| 2016/0020240 A1 | 1/2016 | Hayashi |
| 2017/0053961 A1 | 2/2017 | Hayashi |
| 2017/0180664 A1 | 6/2017 | Kishi |
| 2018/0166493 A1 | 6/2018 | Hayashi |
| 2019/0051691 A1 | 2/2019 | Hayashi |
| 2020/0068157 A1 | 2/2020 | Kishi |
| 2021/0227165 A1 | 7/2021 | Kishi |

FOREIGN PATENT DOCUMENTS

| | | |
|---|---|---|
| JP | 2007-295525 A | 11/2007 |
| JP | 2008-035278 A | 2/2008 |
| JP | 2011-205374 A | 10/2011 |
| JP | 2012-164870 A | 8/2012 |
| JP | 2012-175234 A | 9/2012 |
| JP | 2013-051674 A | 3/2013 |
| JP | 2013-084744 A | 5/2013 |
| JP | 2013-101213 A | 5/2013 |

OTHER PUBLICATIONS

Jan. 19, 2021 Office Action issued in Chinese Patent Application No. 201910337550.5.
Feb. 16, 2016 International Preliminary Report on Patentability issued in International Patent Application No. PCT/JP2014/070874.
Sep. 9, 2014 Search Report issued in International Patent Application No. PCT/JP2014/070874.
Feb. 8, 2017 Extended European Search Report issued in European Patent Application No. 14 83 5954.
Jul. 14, 2017 Office Action issued in U.S. Appl. No. 14/910,428.
Mar. 28, 2018 Office Action issued in U.S. Appl. No. 14/910,428.
Apr. 3, 2018 Office Action issued in Japanese Application No. 2015-531789.
May 3, 2018 Office Action issued in Chinese Patent Application No. 201480044359.7.
Jul. 24, 2018 Office Action issued in U.S. Appl. No. 14/910,428.
Sep. 19, 2018 Office Action issued in Chinese Application No. 201480044359.7.
Oct. 24, 2019 Office Action issued in U.S. Appl. No. 16/395,351.
Oct. 11, 2019 Office Action issued in European Patent Application No. 14 835 954.0.
Oct. 29, 2019 Office Action issued in Japanese Patent Application No. 2018-196396.
Mar. 17, 2020 Office Action issued in Japanese Patent Application No. 2018-196396.
May 6, 2020 Notice of Allowance issued in U.S. Appl. No. 16/395,351.
Sep. 30, 2020 Office Action issued in Indian Patent Application No. 201617004099.
Oct. 29, 2020 Office Action issued in European Patent Application No. 14 835 954.0.
Oct. 8, 2021 Office Action issued in European Patent Application No. 14 835 954.0.
Oct. 12, 2021 Office Action issued in Japanese Patent Application No. 2018-196396.
Jan. 11, 2022 Office Action issued in Japanese Patent Application No. 2020-191181.

\* cited by examiner

ELECTRONIC APPARATUS, METHOD FOR CONTROLLING ELECTRONIC APPARATUS, AND CONTROL PROGRAM

This application is a continuation of U.S. patent application Ser. No. 16/395,351 filed on Apr. 26, 2019, which in turn is a continuation of U.S. patent application Ser. No. 14/910,428 filed on Feb. 5, 2016, which in turn is a National Stage of International Patent Application PCT/JP2014/070874 filed Aug. 7, 2014, which claims the benefit of Japanese Patent Application No. 2013-167308 filed on Aug. 12, 2013. The disclosure of each of the prior applications is incorporated herein by reference in their entirety.

TECHNICAL FIELD

The present invention relates to an electronic apparatus, a method for controlling an electronic apparatus, and a control program.

BACKGROUND ART

Electronic apparatuses each including an image sensor in which a back-illuminated image-capture chip and a signal processing chip are stacked (hereafter referred to as a stacked image sensor) have been proposed (for example, see Patent Literature 1). In a stacked image sensor, a back-illuminated image capture chip and a signal processing chip are stacked so as to be connected via micro-bumps corresponding to blocks each including multiple pixels.

CITATION LIST

Patent Literature

[Patent Literature 1] Japanese Unexamined Patent Application Publication No. 2006-49361

SUMMARY OF INVENTION

Technical Problem

However, there have been proposed only a few electronic apparatuses including a stacked image sensor that captures images on a multiple-block basis. Accordingly, the usability of electronic apparatuses including a stacked image sensor has not been sufficiently improved.

An object of an aspect of the present invention is to divide an image capture region into multiple regions for which different image capture conditions are set and to generate multiple moving images corresponding to the multiple regions.

Solution to Problem

A first aspect of the present invention provides an electronic apparatus including an image sensor configured to capture a first moving image and a second moving image in a first region and a second region, respectively, of an image capture region on different image capture conditions, the second region differing from the first region, and a moving image generation unit configured to generate the first moving image and the second moving image captured in the first region and the second region.

A second aspect of the present invention provides an electronic apparatus including an image sensor configured to generate a first moving image and a second moving image in a first region and a second region, respectively, of an image capture region, the first region differing from the second region.

A third aspect of the present invention provides an electronic apparatus including a setting unit configured to set image capture conditions for first and second regions of an image capture region of an image sensor, the second region differing from the first region and a moving image generation unit configured to generate a first moving image and a second moving image captured in the first region and the second region, respectively.

A fourth aspect of the present invention provides an electronic apparatus including an image capture unit including an image sensor, a division unit configured to divide an image capture region of the image sensor into at least first and second regions, an image capture control unit configured to set different image capture conditions for the first and second regions, and a moving image generation unit configured to generate a first moving image from images captured in the first region and to generate a second moving image from images captured in the second region.

A fifth aspect of the present invention provides a method for controlling an electronic apparatus including an image capture unit, the method including dividing an image capture region of the image sensor into at least first and second regions, setting different image capture conditions for the first and second regions, and generating a first moving image from an image captured in the first region and generating a second moving image from an image captured in the second region.

A sixth aspect of the present invention provides a control program for causing a control unit of an electrode apparatus including an image capture unit to perform a dividing process of dividing an image capture region of the image sensor into at least first and second regions, an image capture control process of setting different image capture conditions for the first and second regions, and a moving image generation process of generating a first moving image from an image captured in the first region and generating a second moving image from an image captured in the second region.

Advantageous Effects of the Invention

According to the aspects of the present invention, it is possible to generate multiple moving images corresponding to multiple regions for which different image capture conditions are set.

EMBODIMENTS OF THE INVENTION

Hereafter, embodiments of the present invention will be described with reference to the drawings. However, the present invention is not limited thereto. To clarify the embodiments, the drawings are scaled as appropriate, for example, partially enlarged or highlighted.

First Embodiment

Figure 1:
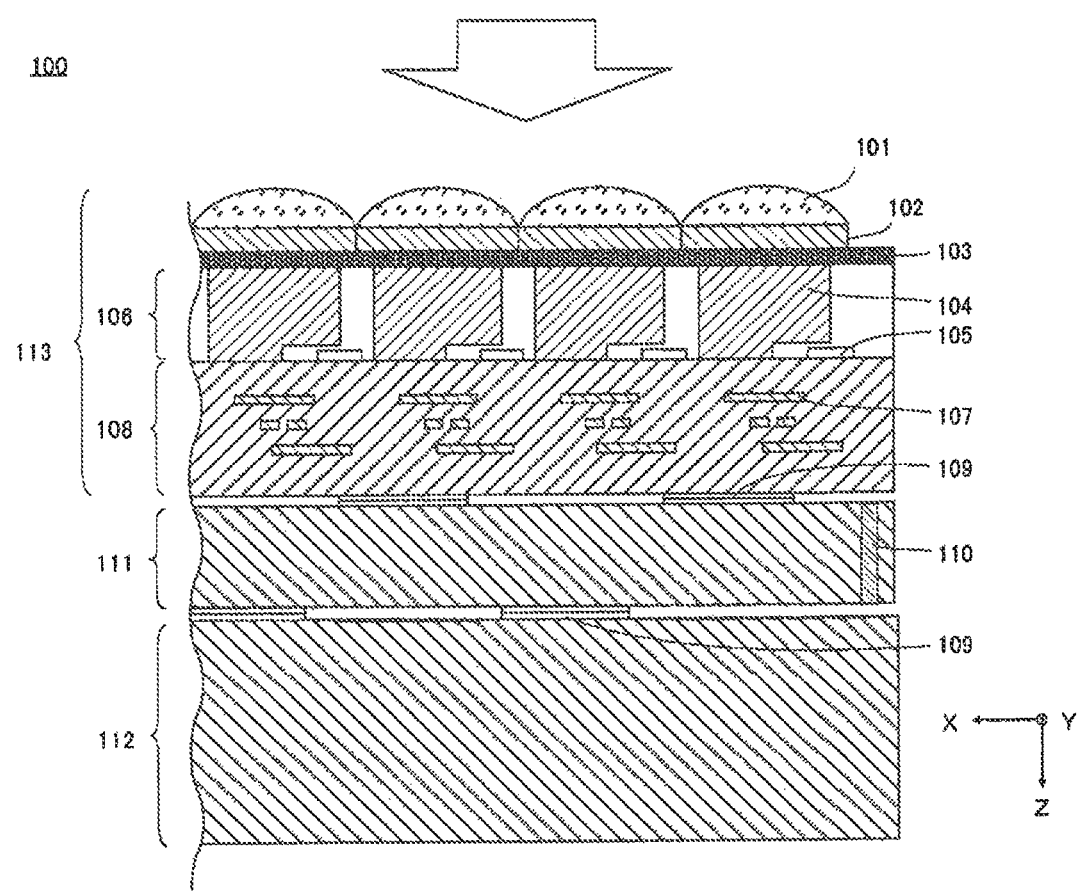
FIG. 1 is a sectional view of a stacked image sensor.

FIG. 1 is a sectional view of a stacked image sensor. A stacked image sensor 100 is disclosed in Japanese Patent Application No. 2012-139026 previously filed by the present applicant. The image sensor 100 includes an image-capture chip 113 configured to output a pixel signal corresponding to incident light, a signal processing chip 111 configured to process the pixel signal, and a memory chip 112 configured to store the pixel signal. The image-capture chip 113, signal processing chip 111, and memory chip 112 are stacked and electrically connected to one another via conductive bumps 109 such as Cu.

As shown in FIG. 1, incident light enters the image sensor 100 in a positive z-axis direction mainly shown by an outline arrow. In the present embodiment, the incident light entry surface of the image-capture chip 113 is referred to as a back surface. Further, as shown by coordinate axes, the direction which is perpendicular to the z-axis and oriented to the left side of the drawing is referred to as a positive x-axis direction, and the direction which is perpendicular to the z- and x-axes and oriented to the viewer is referred to as a positive y-axis direction. In the following some drawings, coordinate axes are shown using the coordinate axes of FIG. 1 as a reference so that the orientations of such drawings are understood.

One example of the image-capture chip 113 is a back-illuminated MOS image sensor. A PD layer 106 is disposed on the back surface of a wiring layer 108. The PD layer 106 includes multiple photodiodes (PDs) 104 disposed two-dimensionally and configured to accumulate charge corresponding to incident light and transistors 105 disposed in a manner corresponding to the PDs 104.

Color filters 102 are disposed over the incident light entry surface of the PD layer 106 with a passivation film 103 therebetween. The color filters 102 are each a filter which transmits a particular wavelength range of visible light. That is, the color filters 102 include multiple color filters which transmit different wavelength ranges and are arranged in a particular manner so as to correspond to the PDs 104. The arrangement of the color filters 102 will be described later. A set of a color filter 102, a PD 104, and a transistor 105 forms one pixel.

Microlenses 101 are disposed on the incident light entry sides of the color filters 102 in a manner corresponding to the pixels. The microlenses 101 condense incident light toward the corresponding PDs 104.

The wiring layer 108 includes lines 107 configured to transmit pixel signals from the PD layer 106 to the signal processing chip 111. The lines 107 may be multilayered and may include passive and active elements. Multiple bumps 109 are disposed on the front surface of the wiring layer 108 and aligned with multiple bumps 109 disposed on the opposite surface of the signal processing chip 111. The aligned bumps 109 are bonded together and electrically connected together, for example, by pressurizing the image-capture chip 113 and signal processing chip 111.

Similarly, multiple bumps 109 are disposed on the opposite surfaces of the signal processing chip 111 and memory chip 112 and aligned with each other. The aligned bumps 109 are bonded together and electrically connected together, for example, by pressurizing the signal processing chip 111 and memory chip 112.

The methods for bonding the bumps 109 together include Cu bump bonding using solid phase diffusion, as well as micro-bump bonding using solder melting. For the bumps 109, it is only necessary to provide, for example, one bump or so with respect to one unit group (to be discussed later). Accordingly, the size of the bumps 109 may be larger than the pitch between the PDs 104. Further, bumps which are larger than the bumps 109 corresponding to a pixel region having the pixels arranged therein (a pixel region 113A shown in FIG. 2) may be additionally provided in peripheral regions other than the pixel region.

The signal processing chip 111 includes a through-silicon via (TSV) 110 configured to connect together circuits disposed on the front and back surfaces thereof. The TSV 110 is disposed in a peripheral region. Alternatively, the TSV 110 may be disposed in a peripheral region of the image-capture chip 113 or in the memory chip 112.

Figure 2:
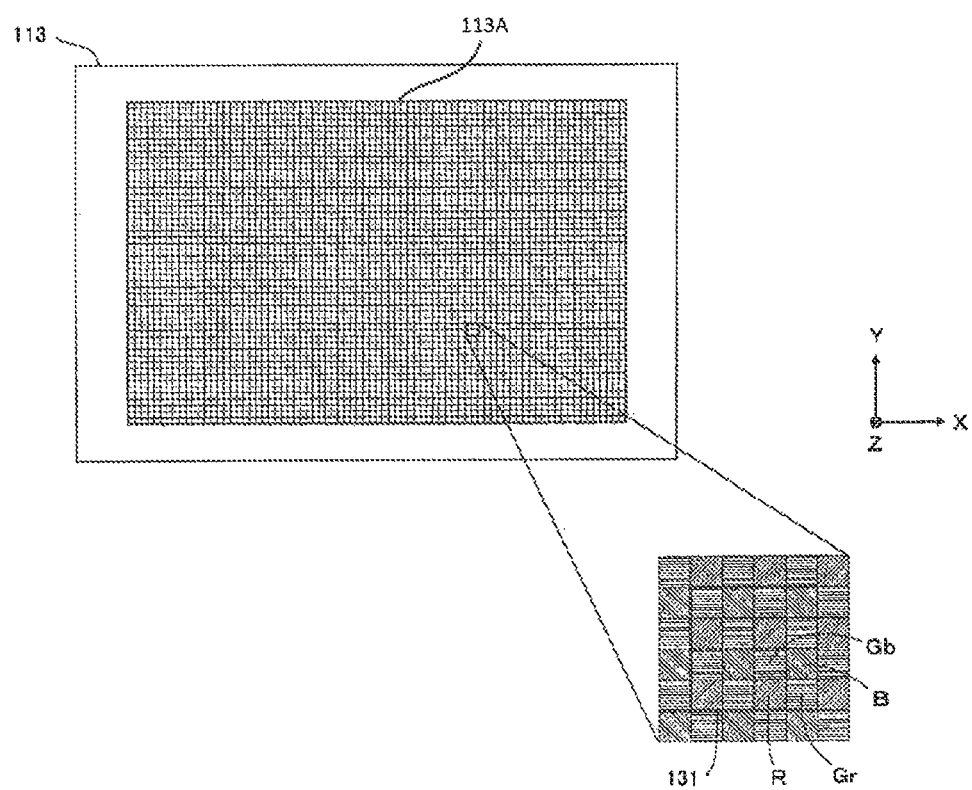
FIG. 2 is a diagram showing the pixel array of an image capture chip and a unit group.

FIG. 2 is a diagram showing the pixel array of the image-capture chip and a unit group. In FIG. 2, the image-capture chip 113 is observed from the back side. The pixel region 113A is the pixel-arranged region of the image-capture chip 113. In the pixel region 113A, 20 million or more pixels are arranged in a matrix. In an example shown in FIG. 2, four adjacent pixels×four adjacent pixels, that is, 16 pixels form one unit group 131. Grid lines in FIG. 2 show a concept that adjacent pixels are grouped into unit groups 131. The number of pixels forming the unit groups 131 is not limited to that described above and may be on the order of 1000, for example, 32 pixels×64 pixels, or may be 1000 or more or less than 1000.

As shown in a partial enlarged view of the pixel region 113A, one unit group 131 includes four so-called Bayer arrays which each includes four pixels, that is, green pixels Gb, Gr, a blue pixel B, and a red pixel R and which are arranged vertically and horizontally. The green pixels are each a pixel having a green filter as a color filter 102 and receive light in the green wavelength band of incident light. Similarly, the blue pixel is a pixel having a blue filter as a color filter 102 and receives light in the blue wavelength band. The red pixel is a pixel having a red filter as a color filter 102 and receives light in the red wavelength band.

Figure 3:
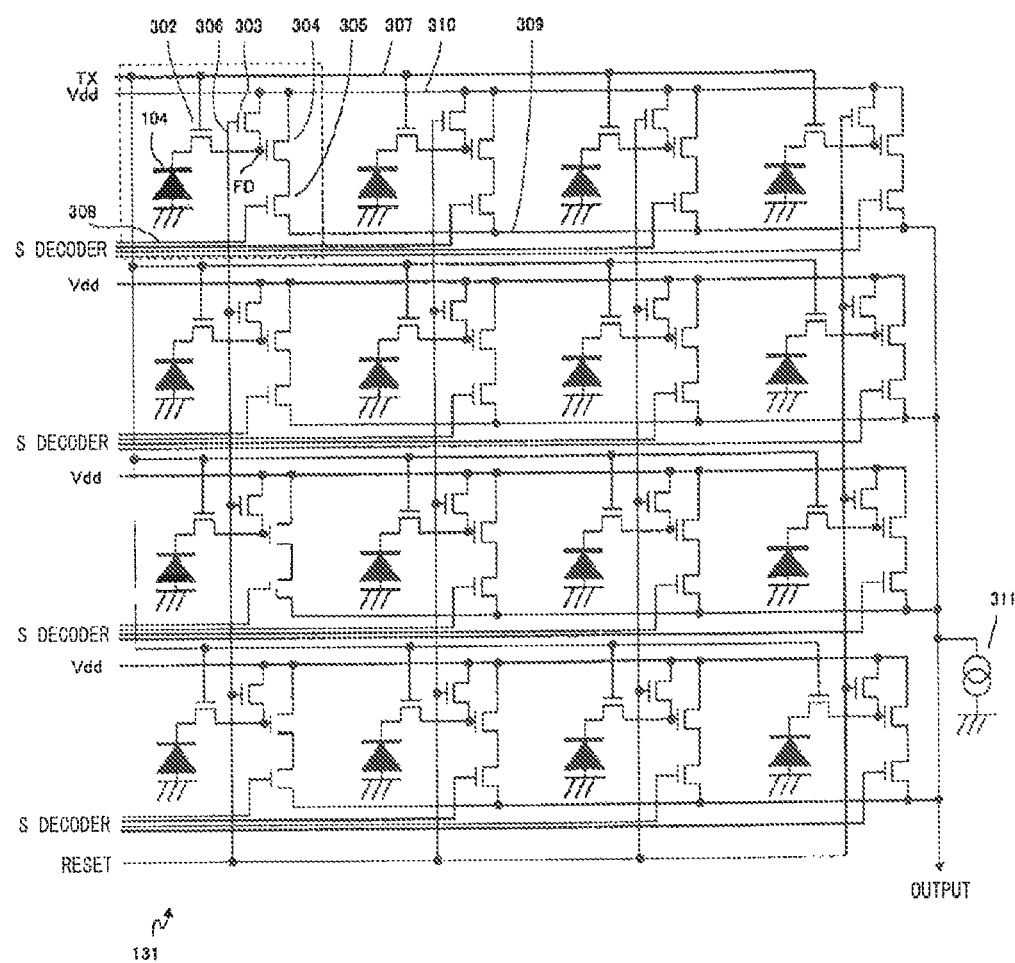
FIG. 3 is a circuit diagram of a unit group of the image capture chip.

FIG. 3 is a circuit diagram of a unit group of the image-capture chip. In FIG. 3, a rectangle surrounded by a dotted line as a representative shows the circuit of one pixel.

At least part of each transistor described below corresponds to one transistor 105 in FIG. 1.

As described above, one unit group 131 includes 16 pixels. Sixteen PDs 104 included in these pixels are connected to corresponding transfer transistors 302. The gates of the transfer transistors 302 are connected to a TX line 307 through which a transfer pulse is supplied. In the present embodiment, the TX line 307 is shared by the 16 transfer transistors 302.

The drain of each transfer transistor 302 is connected to the source of a corresponding reset transistor 303, and so-called floating diffusion FD (charge detection unit) therebetween is connected to the gate of a corresponding amplifier transistor 304. The drains of the reset transistors 303 are connected to a Vdd line 310 through which a power-supply voltage is supplied. The gates of the reset transistors 303 are connected to a reset line 306 through which a reset pulse is supplied. In the present embodiment, the reset line 306 is shared by the 16 reset transistors 303.

The drains of the amplifier transistors 304 are connected to the Vdd line 310, through which a power-supply voltage is supplied. The sources of the amplifier transistors 304 are connected to the drains of corresponding select transistors 305. The gates of the select transistors 305 are connected to corresponding decoder lines 308 through which a selection pulse is supplied. In the present embodiment, the different decoder lines 308 are disposed with respect to the 16 select transistors 305. The sources of the select transistors 305 are connected to a shared output line 309. A load current source 311 supplies a current to the output line 309. That is, the output line 309 with respect to the select transistors 305 is formed by a source follower. The load current source 311 may be disposed in any of the image-capture chip 113 and signal processing chip 111.

Described below is the flow from when the accumulation of charge starts to when pixel signals are outputted after the accumulation ends. Reset pulses are applied to the reset transistors 303 through the reset line 306. Simultaneously, transfer pulses are applied to the transfer transistors 302 through the TX line 307. Thus, the potentials of the PDs 104 and floating diffusion FD are reset.

When the application of the transfer pulses is released, the PDs 104 convert received incident light into charge and accumulate it. Subsequently, when transfer pulses are applied again with reset pulses not being applied, the charge accumulated in each PD 104 is transferred to the corresponding floating diffusion FD. Thus, the potential of the floating diffusion FD is changed from the reset potential to the signal potential after the charge accumulation. When selection pulses are applied to the select transistors 305 through the decoder lines 308, the variation in the signal potential of each floating diffusion FD is transmitted to the output line 309 through the corresponding amplifier transistor 304 and select transistor 305. Based on such a circuit operation, the unit pixels output, to the output line 309, pixel signals corresponding to the reset potentials and pixel signals corresponding to the signal potentials.

As shown in FIG. 3, in the present embodiment, the reset line 306 and TX line 307 are shared by the 16 pixels forming the unit group 131. That is, reset pulses and transfer pulses are simultaneously applied to all the 16 pixels. Accordingly, all the pixels forming the unit group 131 start to accumulate charge at the same timing and end the charge accumulation at the same timing. Note that selection pulses are sequentially applied to the select transistors 305 and therefore pixel signals corresponding to the accumulated charge are selectively outputted to the output line 309. Different reset lines 306, TX lines 307, and output lines 309 are disposed for the respective unit groups 131.

By constructing the circuit on the basis of unit groups 131 as described above, the charge accumulation time can be controlled for each unit group 131. In other words, it is possible to cause the unit groups 131 to output pixel signals based on different charge accumulation times. More specifically, by causing another unit group 131 to accumulate charge several times and to output pixel signals each time while one unit group 131 is caused to accumulate charge once, it is possible to cause the unit groups 131 to output moving image frames at different frame rates.

Figure 4:
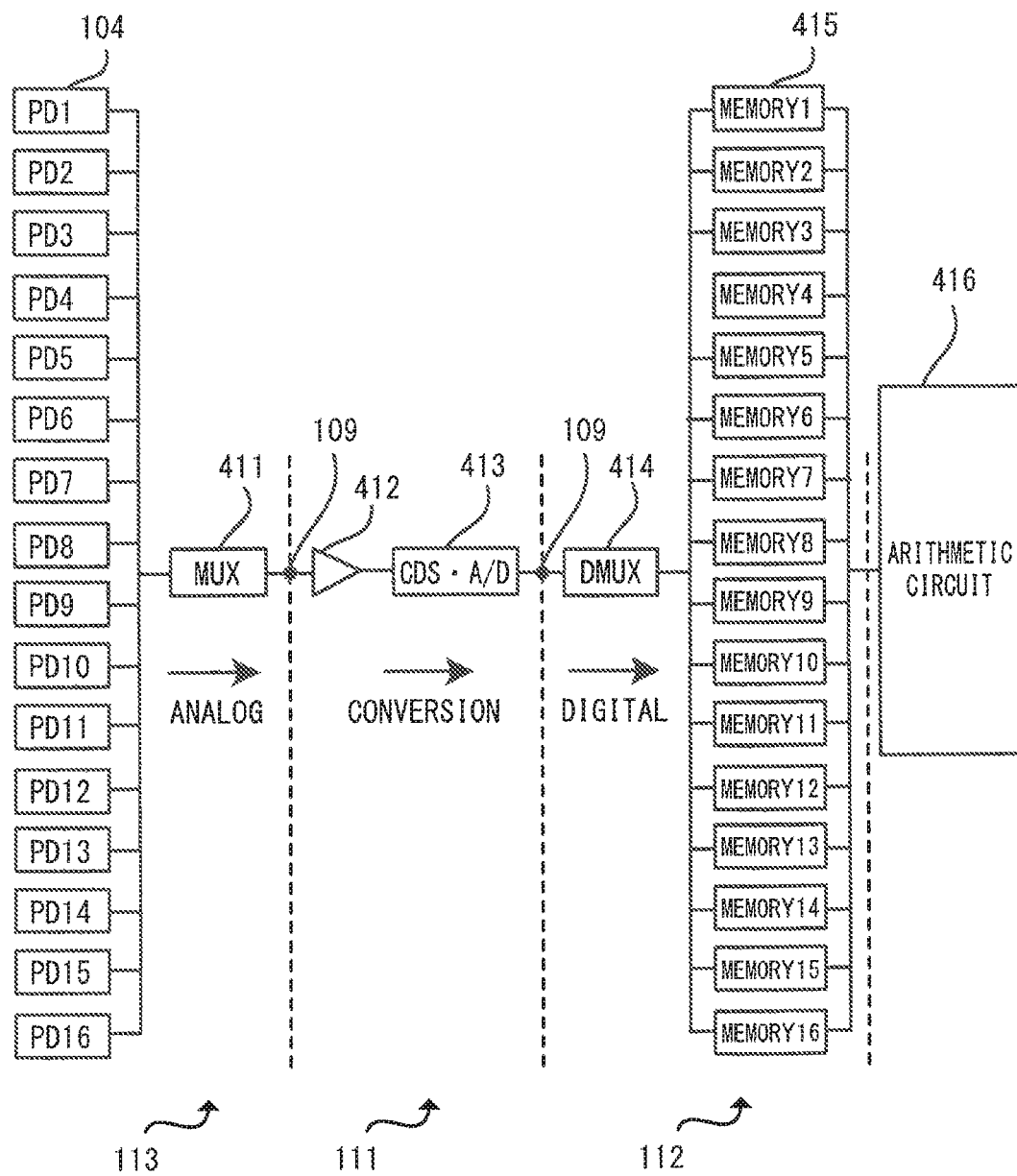
FIG. 4 is a block diagram showing the functional configuration of the image sensor.

FIG. 4 is a block diagram showing the functional configuration of the image sensor. An analog multiplexer 411 sequentially selects 16 PDs 104 forming one unit group 131 and causes each selected PD 104 to output a pixel signal to an output line 309 disposed in a manner corresponding to the unit group 131. The multiplexer 411 is formed along with the PDs 104 in the image-capture chip 113.

The analog pixel signals outputted through the multiplexer 411 are amplified by an amplifier 412 which is formed in the signal processing chip 111. The pixel signals amplified by the amplifier 412 are subjected to correlated double sampling (CDS) and analog-to-digital (A/D) conversion by a signal processing circuit 413 formed in the signal processing chip 111 and configured to perform CDS and A/D conversion. Since the pixel signals are subjected to CDS by the signal processing circuit 413, the noise in the pixel signals is reduced. The A/D-converted pixel signals are passed to a demultiplexer 414 and then stored in corresponding pixel memories 415. The demultiplexer 414 and pixel memories 415 are formed in the memory chip 112.

An arithmetic circuit 416 processes the pixel signals stored in the pixel memories 415 and passes the resulting signals to a subsequent image processing unit. The arithmetic circuit 416 may be disposed in any of the signal processing chip 111 and memory chip 112. While the elements connected to the single unit group 131 are shown in FIG. 4, these elements are disposed for each unit group 131 in practice and operate in parallel. Note that the arithmetic circuit 416 need not necessarily be disposed for each unit group 131. For example, a single arithmetic circuit 416 may sequentially refer to and process the values in the pixel memories 415 corresponding to the respective unit groups 131.

As described above, the output lines 309 are disposed in a manner corresponding to the respective unit groups 131. In the image sensor 100, the image-capture chip 113, signal processing chip 111, and memory chip 112 are stacked. Accordingly, by using, as the output lines 309, the bumps 109 electrically connecting between the chips, the lines can be routed without enlarging the chips in the surface direction.

Next, blocks set in the pixel region 113A (see FIG. 2) of the image sensor 100 will be described. In the present embodiment, the pixel region 113A of the image sensor 100 is divided into multiple blocks. Each block includes at least one unit group 131. Pixels included in the respective blocks are controlled by different control parameters. That is, the control parameter varies between pixel signals acquired from pixels included in one block and pixel signals acquired from pixels included in another block. Examples of a control parameter include the charge accumulation time or frequency, the frame rate, the gain, the thinning-out rate, the number of rows or columns whose pixel signals are summed up, and the digitized bit number. The control parameters may be parameters used in image processing following the acquisition of image signals from the pixels.

As used herein, the charge accumulation time refers to the time from when the PDs 104 start to accumulate charge to when they end the accumulation. The charge accumulation frequency refers to the frequency with which the PDs 104 accumulate charge per unit time. The frame rate refers to the number of frames processed (displayed or recorded) per unit time in a moving image. The frame rate is expressed in frames per second (fps). As the frame rate is increased, a subject (i.e., subjects whose images are to be captured) moves more smoothly in a moving image.

The gain refers to the gain factor (amplification factor) of the amplifier 412. By changing the gain, the ISO sensitivity can be changed. The ISO sensitivity is a standard for photographic films developed by the ISO and represents the level of the weakest light which a photographic film can record. Typically, the sensitivity of image sensors is represented by the ISO sensitivity. In this case, the ability of the image sensor 100 to capture light is represented by the value of the ISO sensitivity. When the gain is increased, the ISO sensitivity is increased as well. For example, when the gain is doubled, the electrical signal (pixel signal) is doubled as well. Thus, appropriate brightness is obtained even when the amount of incident light is halved. However, the increase in gain amplifies noise included in the electric signal, thereby increasing noise.

The thinning-out rate refers to the ratio of the number of pixels from which pixel signals are not read to the total number of pixels in a predetermined region. For example, a thinning-out rate of a predetermined region of 0 means that pixel signals are read from all pixels in the predetermined region. A thinning-out rate of a predetermined region of 0.5 means that pixel signals are read from half the pixels in the predetermined region. Specifically, where a unit group 131 is a Bayer array, one Bayer array unit from which pixel signals are read and one Bayer array unit from which pixel signals are not read are alternately set in the vertical direction, that is, two pixels (two rows) from which pixel signals are read and two pixels (two rows) from which pixel signals are not read are alternately set in the vertical direction. On the other hand, when the pixels from which pixel signals are read are thinned out, the resolution of images is reduced. However, 20 million or more pixels are arranged in the image sensor 100 and therefore, even when the pixels are thinned out, for example, at a thinning-out rate of 0.5, images can be displayed with 10 million or more pixels. For this reason, the user (operator) seems not to worry about such a resolution reduction.

The number of rows whose pixel signals are summed up refers to the number of vertically adjacent pixels whose pixel signals are summed up. The number of columns whose pixel signals are summed up refers to the number of horizontally adjacent pixels whose pixel signals are summed up. Such a summation process is performed, for example, in the arithmetic circuit 416. When the arithmetic circuit 416 sums up pixel signals of a predetermined number of vertically or horizontally adjacent pixels, there is obtained an effect similar to that obtained by thinning out the pixels at a predetermined thinning-out rate and reading pixel signals from the resulting pixels. In the summation process, an average value may be calculated by dividing the sum of the pixel signals by the row number or column number obtained by the arithmetic circuit 416.

The digitized bit number refers to the number of bits of a digital signal converted from an analog signal by the signal processing circuit 413. As the number of bits of a digital signal is increased, luminance, color change, or the like is represented in more detail.

In the present embodiment, the accumulation conditions refer to the conditions on the accumulation of charge in the image sensor 100. Specifically, the accumulation conditions refer to the charge accumulation time or frequency, frame rate, and gain of the control parameters. Since the frame rate can change according to the charge accumulation time or frequency, it is included in the accumulation conditions. Similarly, the correct amount of exposure can change according to the gain, and the charge accumulation time or frequency can change according to the correct amount of exposure. Accordingly, the gain is included in the accumulation conditions.

The image-capture conditions refer to conditions on image-capture of a subject. Specifically, the image-capture conditions refer to control parameters including the accumulation conditions. The image-capture conditions includes control parameters for controlling the image sensor 100 (e.g., the charge accumulation time or frequency, frame rate, gain), as well as control parameters for controlling reading of signals from the image sensor 100 (e.g., thinning-out rate), and control parameters for processing signals from the image sensor 100 (e.g., the number of rows or columns whose pixel signals are summed up, digitized bit number, and control parameters used when an image processing unit 30 (to be discussed later) processes images).

Figure 5:
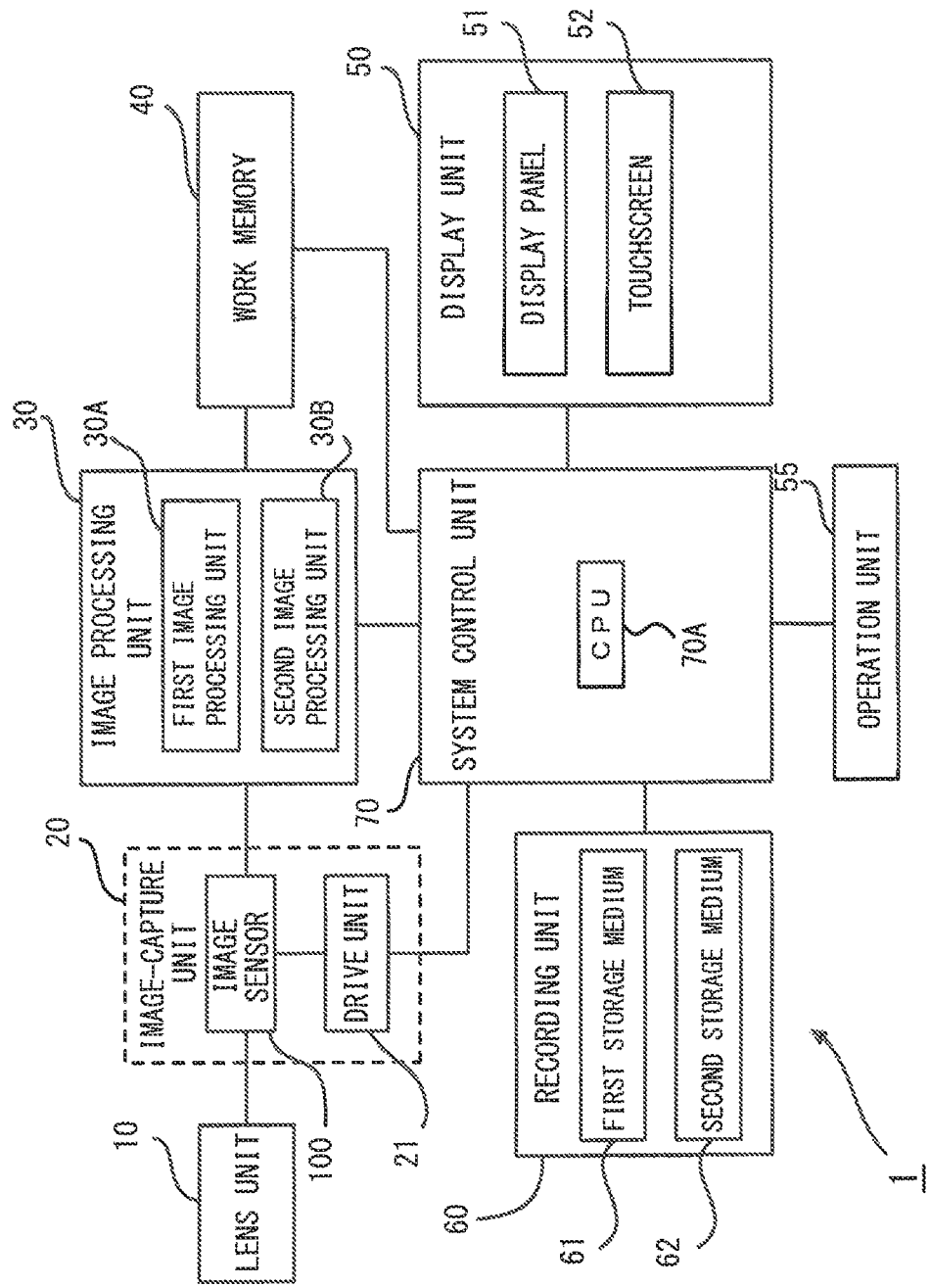
FIG. 5 is a block diagram showing the configuration of an electronic apparatus according to a first embodiment.

FIG. 5 is a block diagram showing the configuration of an electronic apparatus according to the first embodiment. The electronic apparatus 1 shown in FIG. 5 includes digital cameras, smartphones, mobile phones, and personal computers which each have an image capture function. As shown in FIG. 5, an electronic apparatus 1 includes a lens unit 10, an image-capture unit 20, the image processing unit 30, a work memory 40, a display unit 50, an operation unit 55, a recording unit 60, and a system control unit 70. The lens unit 10 is an image-capture optical system including multiple lenses. The lens unit 10 guides a pencil of rays from a subject to the image-capture unit 20. The lens unit 10 may be integral with the electronic apparatus 1 or may be an interchangeable lens which is detachable from the electronic apparatus 1. The lens unit 10 may also include a focus lens or zoom lens.

The image-capture unit 20 includes the image sensor 100 and a drive unit 21. The drive unit 21 is a control circuit configured to control the drive of the image sensor 100 in accordance with an instruction from the system control unit 70. Specifically, the drive unit 21 controls the charge accumulation time or frequency, which is a control parameter, by controlling the timing (or the cycle of the timing) when reset pulses or transfer pulses are applied to the reset transistors 303 or transfer transistors 302, respectively. The drive unit 21 also controls the frame rate by controlling the timing (or the cycle of timing) when reset pulses, transfer pulses, or selection pulses are applied to the reset transistors 303, transfer transistor 302, or select transistors 305, respectively. The drive unit 21 also controls the thinning-out rate by setting pixels to which reset pulses, transfer pulses, and selection pulses are applied.

The drive unit 21 also controls the ISO sensitivity of the image sensor 100 by controlling the gain (also called the gain factor or amplification factor) of the amplifier 412. The drive unit 21 also sets the number of rows or columns whose pixel signals are summed up by transmitting an instruction to the arithmetic circuit 416. The drive unit 21 also sets the digitized bit number by transmitting an instruction to the signal processing circuit 413. The drive unit 21 also sets blocks in the pixel region (image-capture region) 113A of the image sensor 100. As seen above, the drive unit 21 serves as an image sensor control unit that causes the image sensor 100 to capture an image under image-capture conditions which vary among the blocks and then to output pixel signals. The system control unit 70 transmits an instruction about the position, shape, range, or the like of blocks to the drive unit 21.

The image sensor 100 passes the pixel signals from the image sensor 100 to the image processing unit 30. The image processing unit 30 generates image data by performing various types of image processing on raw data composed of the pixel signals of the pixels using the work memory 40 as work space. The image processing unit 30 includes a first image processing unit 30A and a second image processing unit 30B. When the load of image processing is high, the processing is distributed to the first image processing unit 30A and second image processing unit 30B. The first image processing unit 30A and second image processing unit 30B then perform the distributed processing in parallel.

In the present embodiment, as will be described later, the system control unit 70 (specifically, a division unit 71 shown in FIG. 7) divides the pixel region (image capture region) 113A of the image sensor 100 into at least first and second regions. The system control unit 70 (specifically, an image capture control unit 72 shown in FIG. 7) also controls the drive of the image sensor 100 so that the image sensor 100 captures images in the first and second regions on different image capture conditions. In this case, for example, the first image processing unit 30A performs image processing on signals from the first region, and the second image processing unit 30B performs image processing on signals from the second region. Note that the pixel region (image capture region) 113A of the image sensor 100 need not be divided into the two regions composed of the first and second regions and may be divided into multiple regions composed of a first region, a second region, a third region, and the like. In this case, image processing with respect to the multiple regions is distributed to the first image processing unit 30A and second image processing unit 30B as appropriate. The distribution of image processing may be previously determined on the basis of the number of regions obtained by division, the ranges of the regions, or the like. The system control unit 70 may determine the distribution on the basis of the number of regions obtained by division, the ranges of the regions, or the like.

The image processing unit 30 performs various types of image processing. For example, the image processing unit 30 performs color signal processing (tone correction) on signals obtained from a Bayer array so as to generate RGB image signals. The image processing unit 30 then performs image processing such as white balance adjustment, sharpness adjustment, gamma correction, gradation adjustment, or the like on the RGB image signals. The image processing unit 30 compresses the resulting signals in a predetermined compression format (JPEG format, MPEG format, or the like), if necessary. The image processing unit 30 then outputs the resulting image data to the recording unit 60. The image processing unit 30 also outputs the image data to the display unit 50.

In the present embodiment, the image processing unit 30 performs the above processes, as well as detects a main subject from the image data. As used herein, the term "main subject" refers to a subject which is noted or assumed to be noted by the user (operator), of subjects whose images are to be captured. The number of main subjects in the image data is not limited to one, and multiple main subjects may be present (for example, see FIG. 11).

Parameters referred to when the image processing unit 30 performs image processing are also included in the control parameters (image capture conditions). For example, parameters such as color signal processing (tone correction), white balance adjustment, gradation adjustment, and compressibility are included in the control parameters. The signals read from the image sensor 100 vary with the charge accumulation time or the like, and the parameters referred to when image processing is performed also vary with the variations in the signals. The image processing unit 30 sets different control parameters for the respective blocks and performs image processing such as color signal processing on the basis of the control parameters.

The image processing unit 30 extracts or discards frames corresponding to predetermined timings from multiple frames chronologically obtained from the image capture unit 20. Thus, it is possible to reduce the amount of data to reduce the load on subsequent processes. The image processing unit 30 also calculates one or more frames to be interpolated between multiple frames chronologically obtained from the image capture unit 20 and then interpolates the calculated one or more frames between the multiple frames. Thus, it is possible to play back moving images in such a manner that the images move more smoothly. While the drive unit 21 is configured to control the thinning-out rate, other configurations may be employed. For example, the image processing unit 30 or arithmetic circuit 416 may control the thinning-out rate by discarding predetermined pixel signals of pixel signals read from all the pixels by the drive unit 21.

The work memory 40 temporarily stores image data or the like when the image processing unit 30 processes images. The display unit 50 is, for example, a liquid crystal display panel. As shown in FIG. 5, the display unit 50 includes a display panel 51 and a touchscreen 52. The display unit 51 displays images (still images, moving images, live view images) captured by the image capture unit 20, or various types of information. The touchscreen 52 is formed on the display screen of the display panel 51. When the user touches the touchscreen 52 to perform an operation such as selection of a region in an image, the touchscreen 52 outputs a signal indicating the touched position to the system control unit 70. Also, when the user touches the touchscreen 52 to set the image capture mode, image capture condition, or screen change, the touchscreen 52 outputs a signal indicating the touched position to the system control unit 70.

The operation unit 55 includes a release switch, a moving image switch, and other types of operation switches operated by the user. The operation unit 55 outputs a signal corresponding to an operation performed by the user to the system control unit 70. The user makes a shooting preparation such as automatic focusing (AF) or automatic exposure (AE) by pressing the release switch halfway.

The recording unit 60 has two card slots into which two recording media (first recording medium 61, second recording medium 62), such as memory cards, can be inserted. The recording unit 60 stores image data generated by the image processing unit 30 or various types of data in the recording media (first recording medium 61, second recording medium 62) inserted in the card slots. In the present embodiment, as described above, the first image processing unit 30A and second image processing unit 30B perform image processing on signals from the first region and signals from the second region, respectively, in parallel. At this time, the first recording medium 61 stores image data based on the signals from the first region in response to an operation of the release switch or moving image switch. Similarly, the second recording medium 62 stores image data based on the signals from the second region in response to an operation of the release switch or moving image switch. The recording unit 60 also includes an internal memory. The recording unit 60 may record, in the internal memory, the image data generated by the image processing unit 30 or various types of data.

The system control unit 70 controls the entire processing and operation of the electronic apparatus 1. The system control unit 70 includes a central processing unit (CPU) 70A. In the present embodiment, the system control unit 70 divides the image capture surface (pixel region 113A) of the image sensor 100 (image capture chip 113) into multiple blocks and causes the image sensor 100 to capture images in the blocks with different charge accumulation times (or charge accumulation frequencies), different frame rates, and/or different gains. For this reason, the system control unit 70 transmits the positions, shapes, and ranges of the blocks and the accumulation conditions for the blocks to the drive unit 21. The system control unit 70 also causes the image sensor 100 to capture images in the blocks with different thinning-out rates, the different numbers of rows or columns whose pixel signals are summed up, and/or different digitized bit numbers. For this reason, the system control unit 70 transmits, to the drive unit 21, the image capture conditions (thinning-out rates, the numbers of rows or columns whose pixel signals are summed up, and digitized bit numbers) for the blocks. The image processing unit 30 performs image processing on image capture conditions (control parameters such as color signal processing, white balance adjustment, gradation adjustment, and compressibility) which vary among the blocks. For this reason, the image processing unit 70 transmits, to the image processing unit 30, the image capture conditions (control parameters such as color signal processing, white balance adjustment, gradation adjustment, and compressibility) for the blocks.

The system control unit 70 records the image data generated by the image processing unit 30 in the recording unit 60. The system control unit 70 also outputs the image data generated by the image processing unit 30 to the display unit 50 so that images are displayed on the display unit 50. The system control unit 70 also reads image data recorded in the recording unit 60 and outputs it to the display unit 50 so that images are displayed on the display unit 50. The images displayed on the first display unit 51 are still images, moving images, or live view images. As used herein, the term "live view images" refer to images displayed on the display unit 50 on the basis of image data sequentially generated and outputted by the image processing unit 30. The user uses live view images to check images of the subject being captured by the image capture unit 20. Live view images are also called through images or preview images.

Figure 6:
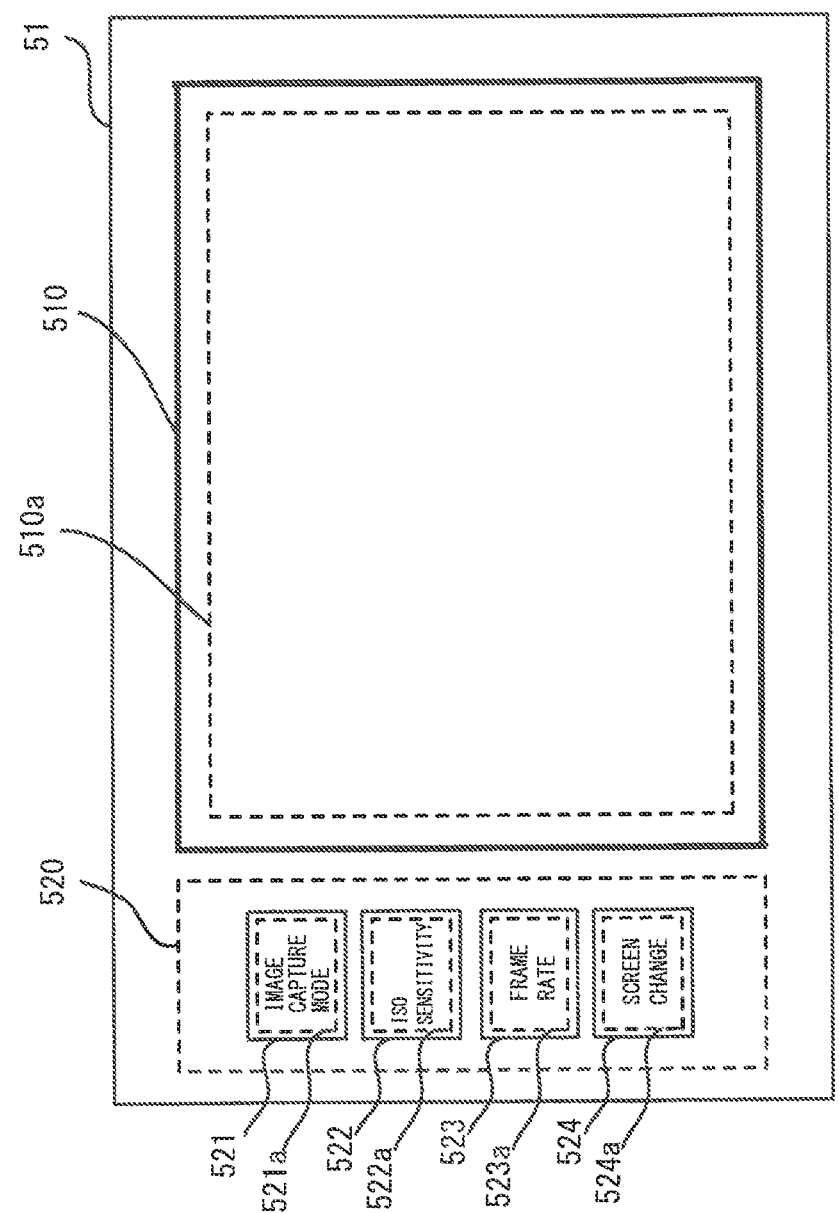
FIG. 6 is a diagram showing an example of the display screen of a display unit.

FIG. 6 is a diagram showing an example of the display screen of the display unit. As shown in FIG. 6, the display panel 51 of the display unit 50 includes an image display region 510 and an operation button display region 520. The image display region 510 is a region for displaying images captured by the image capture unit 20, that is, still images, moving images, and live view images. The operation button display region 520 is a region for displaying menus on which the user sets image capture conditions or the like.

The operation button display region 520 is disposed near the image display region 510. Menus (menu images) for the user to set the image capture mode, image capture condition, and display screen are displayed in the operation button display region 520. An image capture mode button 521 is a menu for the user to set the image capture mode. An ISO sensitivity button 522 and a frame rate button 523 are menus for the user to set the image capture conditions. A screen change button 524 is a menu for the user to set the screen change. Hereafter, the image capture mode button 521, ISO sensitivity button 522, frame rate button 523, and screen change button 524 will be simply referred to as the "image capture mode 521," "ISO sensitivity 522," "frame rate 523," and "screen change 524," respectively.

The image capture mode 521 is a button that the user presses to set (select) the image capture mode. The ISO sensitivity 522 is a button that the user presses to set the ISO sensitivity (i.e., gain). The frame rate 523 is a button that the user presses to set the frame rate of moving images. The screen change 524 is a button that the user presses to display images captured in a partial region, over the entire display screen in an enlarged manner using an electronic zoom (digital zoom) (see FIGS. 13, 14) or to display an image on a sub-screen (see FIG. 14).

The image capture mode includes a still image mode in which still images are captured and a moving image mode in which moving images are captured. The moving image mode includes a first moving image mode and a second moving image mode. The still image mode refers to an image capture mode in which the image sensor 100 captures still images of the subject using the pixel region (image capture region) 113A thereof as a single region without the division unit 71 dividing the pixel region 113A. The still image mode is a typical still image capture mode.

The first moving image mode refers to an image capture mode in which the image sensor 100 captures moving images of the subject using the pixel region (image capture region) 113A thereof as a single region without the division unit 71 dividing the pixel region 113A. The first moving image mode is a typical moving image capture mode. The second moving image mode is an image capture mode in which the division unit 71 divides the pixel region 113A into multiple regions including at least first and second regions and the image sensor 100 captures moving images of the same subject in each of the multiple regions.

The touchscreen 52 is disposed on the image display region 510 and operation button display region 520. A touch region 510*a* of the touchscreen 52 is formed on the image display region 510. When the touch region 510*a* detects that it has been pressed (touched) by the user, it outputs a detection signal indicating the pressed position to the system control unit 70.

A touch region 521*a* is formed so as to overlap the image capture mode 521. A touch region 522*a* is formed so as to overlap the ISO sensitivity 522. A touch region 523*a* is formed so as to overlap the frame rate 523. A touch region 524*a* is formed so as to overlap the screen change 524. When any of the touch regions 521*a* to 524*a* detects that it has been pressed (touched) by the user, the touch region outputs a detection signal indicating the pressed position (the pressed touch region) to the system control unit 70.

The user may operate the operation unit 55 in place of the touchscreen 52 to select the image capture mode, image capture condition, or display screen change.

Figure 7:
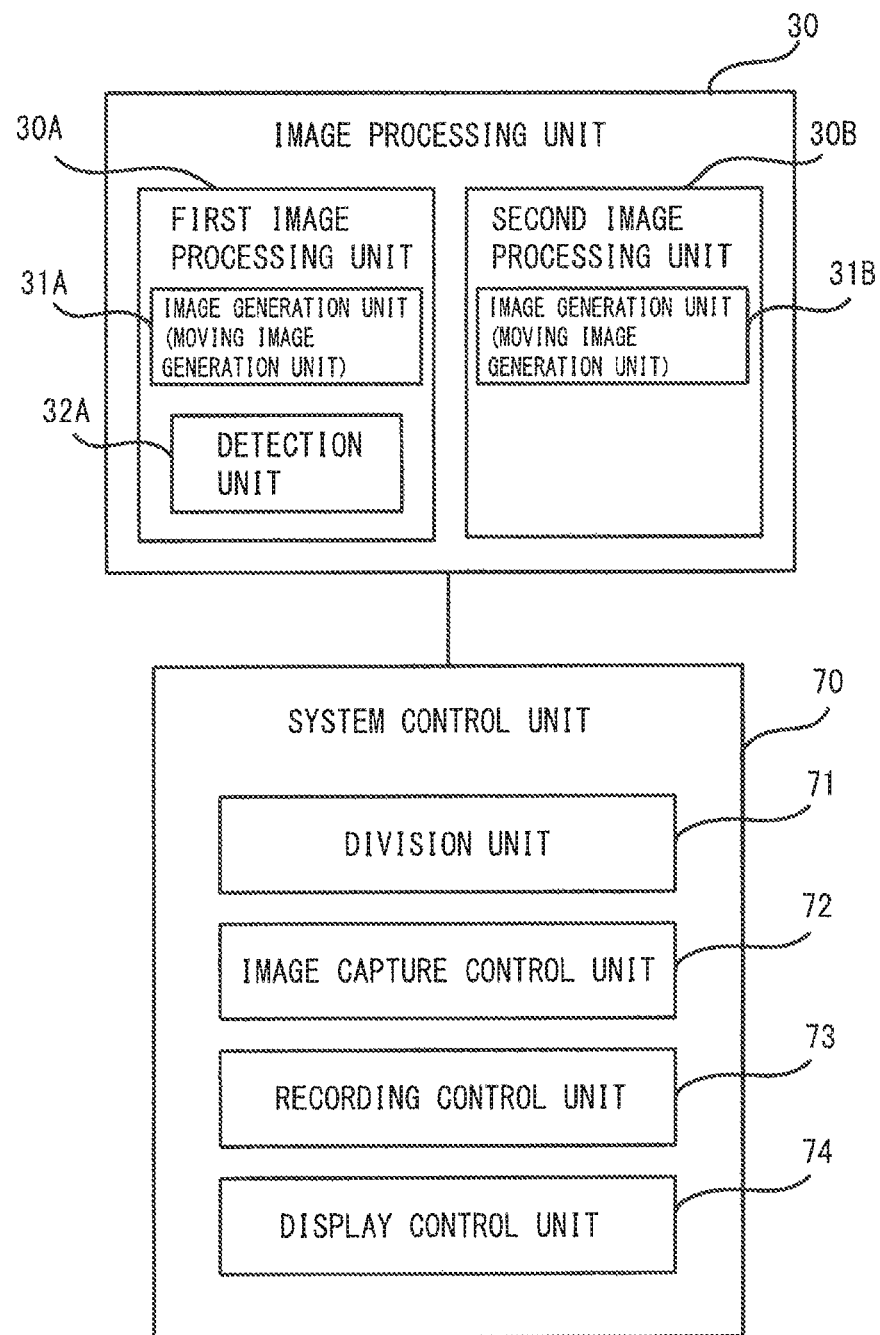
FIG. 7 is a function block diagram of an image processing unit and a system control unit.

FIG. 7 is a function block diagram of the image processing unit and system control unit shown in FIG. 5. As shown in FIG. 7, the first image processing unit 30A includes an image generation unit (moving image generation unit) 31A and a detection unit 32A. The image generation unit 31A generates image data by performing various types of image processing on RAW data outputted from the image capture unit 20 and composed of the pixel signals from the pixels in the first region. The detection unit 32A detects a main subject from the image data generated by the image generation unit 31A. In the present embodiment, the detection unit 32A makes a comparison among multiple pieces of image data chronologically obtained from live view images generated by the image generation unit 31A and detects a moving subject as a main subject. The detection unit 32A also detects a main subject using, for example, a face detection function as described in Japanese Unexamined Patent Application Publication No. 2010-16621 (U.S. 2010/0002940). In addition to face detection, the detection unit 32A also detects a human body included in the image data as a main subject, as described in Japanese Unexamined Patent Application Publication No. 2010-16621 (U.S. 2010/0002940).

The second image processing unit 30B includes an image generation unit (moving image generation unit) 31B. The image generation unit 31B generates image data by performing various types of image processing on RAW data outputted from the image capture unit 20 and composed of the pixel signals from the pixels in the second region. While the second image processing unit 30B does not include a detection unit, it may include a detection unit. There may be employed a configuration in which the first image processing unit 30A does not include the detection unit 32A and the second image processing unit 30B includes a detection unit. In the present embodiment, the image generation unit 31A and image generation unit 31B may be collectively referred to as the image generation unit 31.

The system control unit 70 includes a division unit 71, an image capture control unit 72, a recording control unit 73, and a display control unit 74. The division unit 71 divides the pixel region (image capture region) 113A of the image sensor 100 into multiple regions on a block basis. The division unit 71 divides the pixel region 113A into multiple regions on the basis of a predetermined block arrangement pattern of the pixel region 113A [see FIGS. 8(A) to 8(D)]. In response to the user touching any menu for setting the image capture conditions (ISO sensitivity 522, frame rate 523), the image capture control unit 72 sets different image capture conditions for the multiple regions generated by the division unit 71. Also, in response to the user operating the release switch or moving image switch, the image capture control unit 72 controls the drive of the image sensor 100. Even during capture of live view images (that is, after starting an image capture operation following power-on), the drive control unit 72 controls the drive of the image sensor 100.

The recording control unit 73 records, in the recording unit 60, pieces of moving image data corresponding to the multiple regions generated by the image generation unit 31. For example, the recording control unit 73 records, in the first recording medium 61, image data corresponding to the first region generated by the image generation unit 31A and records, in the second recording medium 62, image data corresponding to the second region generated by the image generation unit 31B. The display control unit 74 outputs the image data generated by the image generation unit 31 to the display unit 50 so that images (still images, moving images, live view images) are displayed on the image display region 510 of the display unit 50. Also, in response to the user operating the screen change 524, the display control unit 74 changes the display screen. For example, in response to the user operating the screen change 524, the display control unit 74 displays an image corresponding to a partial region, over the entire display screen in an enlarged manner using an electronic zoom and displays an image on the sub-screen.

The division unit 71, image capture control unit 72, recording control unit 73, and display control unit 74 of the system control unit 70 are implemented when the CPU 70A performs processing on the basis of a control program.

Figure 8:
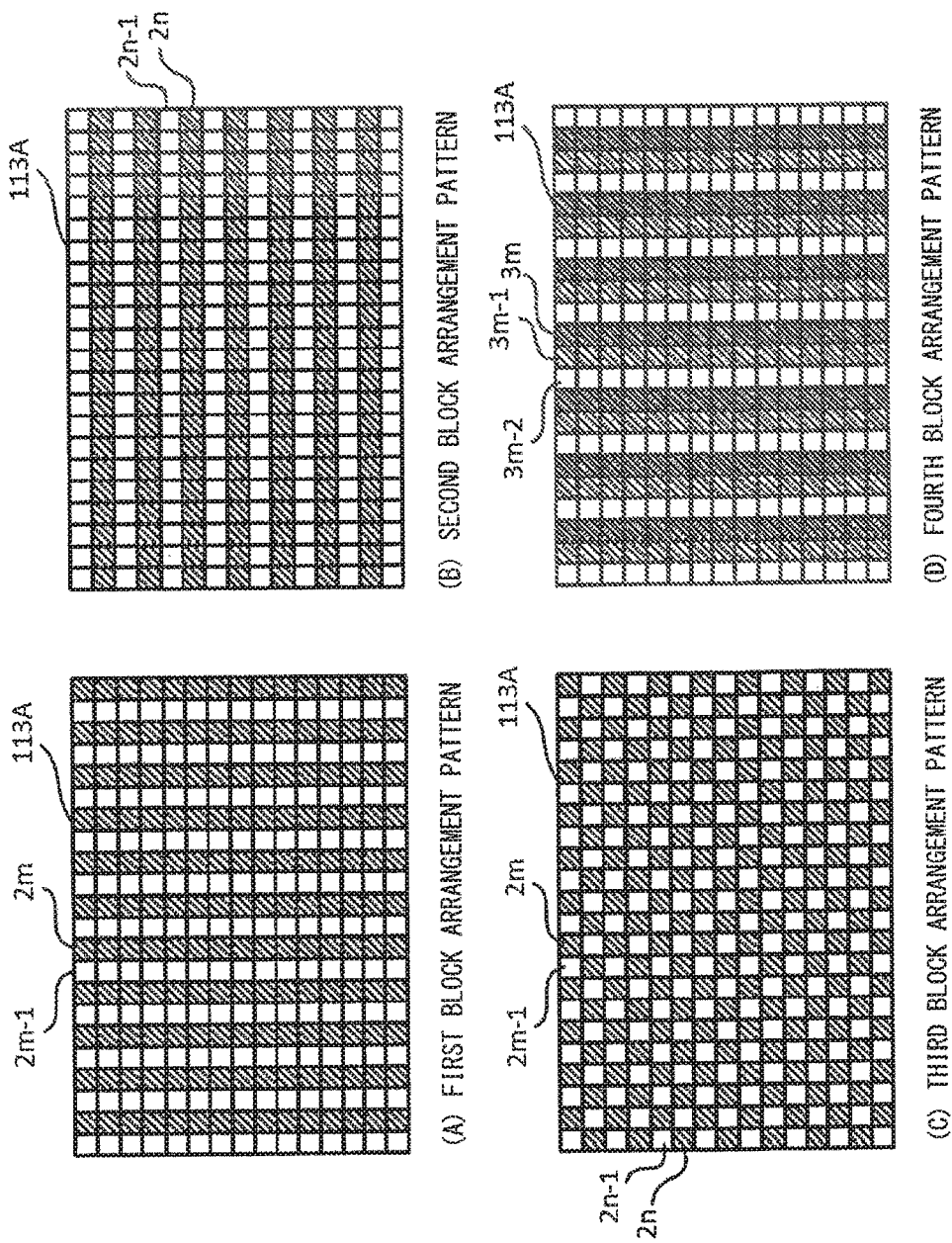
FIG. 8 includes diagrams showing block arrangement patterns.

Next, block arrangement patterns set by the division unit 71 will be described. FIG. 8 includes diagrams each showing a block arrangement pattern, in which FIG. 8(A) shows a first block arrangement pattern; FIG. 8(B) shows a second block arrangement pattern; FIG. 8(C) shows a third block arrangement pattern; and FIG. 8(D) shows a fourth block arrangement pattern.

The first block arrangement pattern shown in FIG. 8(A) is a block arrangement pattern in which the pixel region 113A is divided into two regions, first and second regions. In the first block arrangement pattern, the first region of the pixel region 113A is composed of blocks in $(2m-1)$th columns, and the second region thereof is composed of blocks in $(2m)$th columns. That is, the blocks in the pixel region 113A are grouped into the odd columns and even columns. As used herein, m is a positive integer (m=1, 2, 3, etc.).

The second block arrangement pattern shown in FIG. 8(B) is also a block arrangement pattern in which the pixel region 113A is divided into two regions, first and second regions. In the second block arrangement pattern, the first region of the pixel region 113A is composed of blocks in $(2n-1)$th rows, and the second region thereof is composed of blocks in $(2n)$th rows. That is, the blocks in the pixel region 113A are grouped into the odd rows and even rows. As used herein, n is a positive integer (n=1, 2, 3, etc.).

The third block arrangement pattern shown in FIG. 8(C) is also a block arrangement pattern in which the pixel region 113A is divided into two regions, first and second regions. In the third block arrangement pattern, the first region of the pixel region 113A is composed of blocks in $(2m-1)$th columns and in $(2n-1)$th rows and blocks in $(2m)$th columns and in $(2n)$th rows. The second region thereof is composed of blocks in $(2m)$th columns and in $(2n-1)$th rows and blocks in $(2m-1)$th columns and in $(2n)$th rows. That is, the pixel region 113A is divided in such a manner that the blocks form a check pattern. As used herein, m and n are positive integers (m=1, 2, 3, . . . ; n=1, 2, 3, . . . ).

The fourth block arrangement pattern shown in FIG. 8(D) is a block arrangement pattern in which the pixel region 113A is divided into three regions, first to third regions. In the fourth block arrangement pattern, the first region of the pixel region 113A is composed of blocks in $(3m-2)$th columns; the second region thereof is composed of blocks in $(3m-1)$th columns; and the third region thereof is composed of blocks in $(3m)$th columns. As used herein, m is a positive integer (m=1, 2, 3, etc.).

While, in FIG. 8, a small number of blocks are set in the pixel region 113A to make it easy to see the block arrangement in each region, a larger number of blocks than the number of blocks shown in FIG. 8 may be set.

Figure 9:
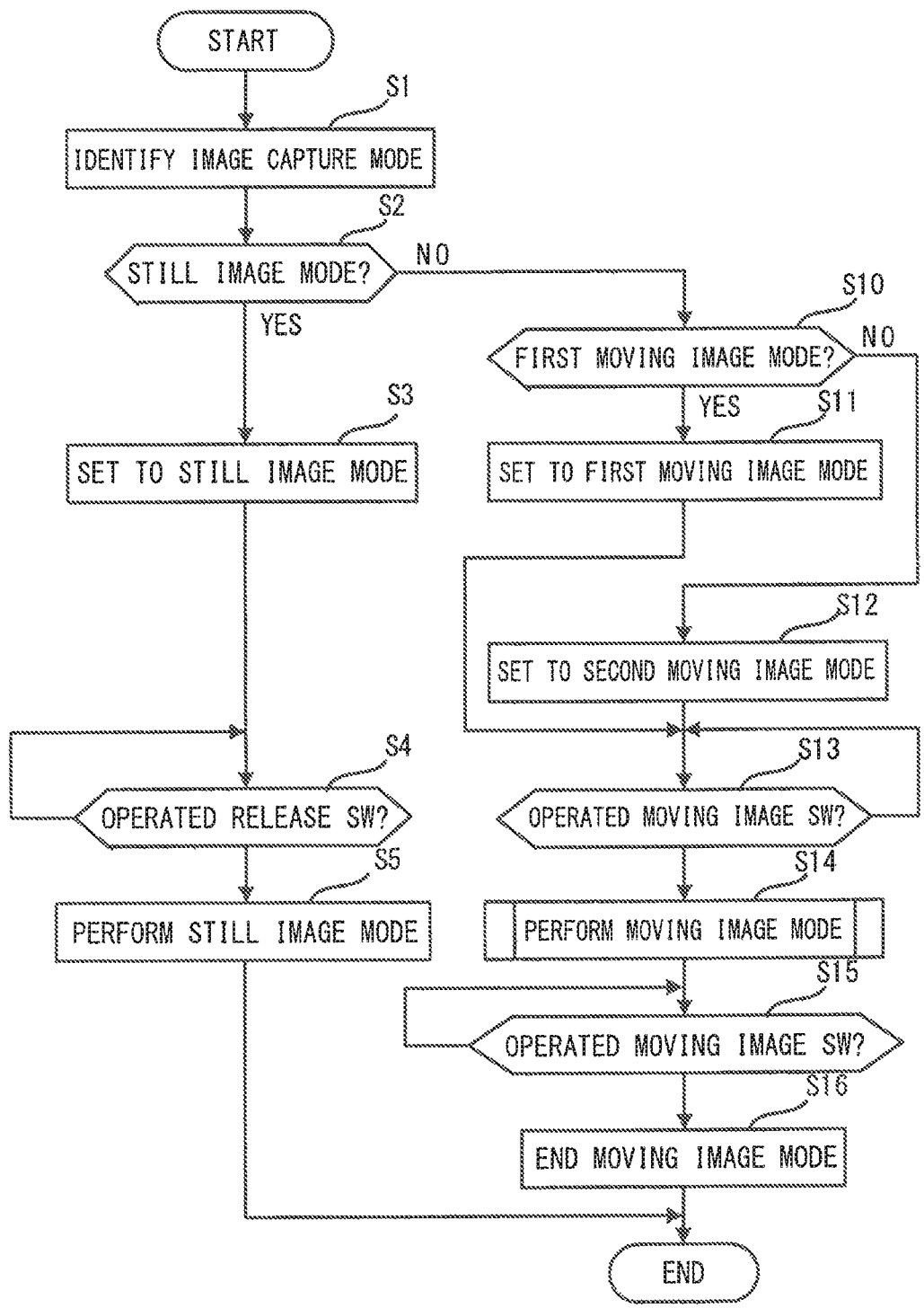
FIG. 9 is a flowchart showing an image capture operation performed by the system control unit.
Figure 10:
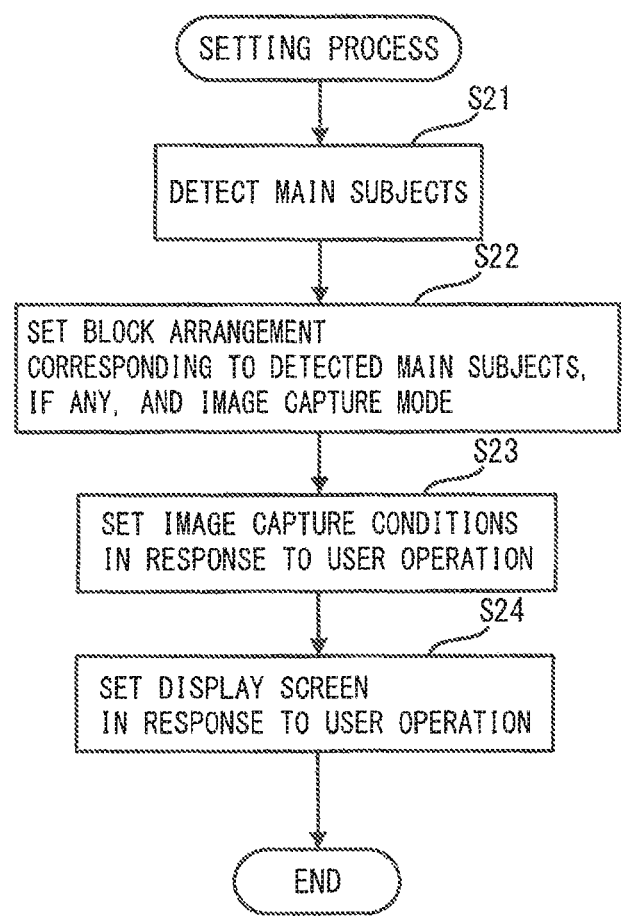
FIG. 10 is a flowchart showing a block arrangement pattern setting process.

Next, an image capture operation according to the first embodiment will be described. FIG. 9 is a flowchart showing an image capture operation performed by the system control unit. FIG. 10 is a flowchart showing a setting process. In the process shown in FIG. 9, the system control unit 70 starts to capture images when the electronic apparatus 1 is powered on. Although not shown in FIG. 9, when the system control unit 70 starts to capture images, the display control unit 73 displays live view images captured by the image capture unit 20 in the image display region 510 of the display unit 51, as well as displays the menus 521 to 524 in the operation button display region 520 of the display panel 51. Since live view images need not be images in which the subject moves smoothly, the drive control unit 72 controls the drive of the image sensor 100 so that the image sensor 100 captures images at a low frame rate.

The user selects the image capture mode by touching the image capture mode 521. The division unit 71 identifies the image capture mode that the user has selected by touching the image capture mode 521 (step S1). The division unit 71 determines whether the image capture mode selected by the user is the still image mode (step S2). If the division unit 71 determines that the image capture mode is the still image mode, it sets the image capture mode to the still image mode (step S3). Then, the image capture control unit 72 determines whether the user has operated the release switch (whether the user has pressed it all the way following halfway) (step S4).

If the image capture control unit 72 determines that the user has operated the release switch, it causes the image capture unit 20 to capture images in the still image mode (step S5). Also in step S5, the recording control unit 73 records still images captured by the image capture unit 20 in the recording unit 60 (first recording medium 61 or first recording medium 61). Also in step S5, the display control unit 74 displays the still images captured by the image capture unit 20 in the image display region 510 of the display panel 51. Image capture in the still image mode is similar to typical still image capture and therefore will not be described in detail.

If the division unit 71 determines in step S2 that the image capture mode is not the still image mode, that is, the image capture mode is the moving image mode, it determines whether the moving image mode is the first moving image mode (step S10). If the division unit 71 determines that the moving image mode is the first moving image mode, it sets the image capture mode to the first moving image mode (step S11). In contrast, if the division unit 71 determines that the moving image mode is not the first moving image mode, that is, the moving image mode is the second moving image mode, it sets the image capture mode to the second moving image mode (step S12).

In step S11 or step S12, the division unit 71 performs the setting process shown in FIG. 10. In the process shown in FIG. 10, the division unit 71 instructs the image processing unit 30 (first image processing unit 30A) to detect main subjects (step S21). The detection unit 32A then detects moving subjects and non-moving subjects by making a comparison among multiple pieces of image data chronologically obtained from live view images. In the present embodiment, the detection unit 32A recognizes a face in each piece of image data on the basis of the eyes, mouse, the color of the skin, and the like and detects the face as a main subject. In the present embodiment, the detection unit 32A detects the faces, as well as detects a human body (person) included in each piece of image data as a main subject. The detection unit 32A then outputs the detection result along with the pieces of image data to the system control unit 70. The division unit 71 checks whether there are main subjects, on the basis of the detection result from the detection unit 32A. The division unit 71 then sets a region (s) corresponding to the main subject (s), if any, and the image capture mode in the pixel region 113A (step S22).

Specifically, if the image capture mode is the first moving image mode, the division unit 71 does not divide the pixel region 113A into multiple regions. That is, the division unit 71 sets the entire pixel region 113A as a single region. At this time, the division unit 71 outputs, to the drive unit 21, an instruction signal instructing the drive unit 21 to set the entire pixel region 113A as a single region.

In contrast, if the image capture mode is the second moving image mode, the division unit 71 selects one of the block arrangement patterns shown in FIGS. 8(A) to 8(D). The division unit 71 then checks whether the main subject (s) is a moving subject, on the basis of the detection result from the detection unit 32A. If the main subject (s) is not a moving subject but a non-moving subject, the division unit 71 sets first and second regions in accordance with the third block arrangement pattern shown in FIG. 8(C). If the main subject (s) is a moving subject, the division unit 71 identifies the moving direction (s) of the moving subject (s). If the moving direction (s) of the moving subject (s) is mostly vertical, the division unit 71 sets first and second regions in accordance with the first block arrangement pattern shown in FIG. 8(A). If the moving direction (s) of the moving subject (s) is mostly horizontal, the division unit 71 sets first and second regions in accordance with the second block arrangement pattern shown in FIG. 8(B). Further, if the moving subject (s) is moving fast vertically, the division unit 71 sets first to third regions in accordance with the fourth block arrangement pattern shown in FIG. 8(D). In step S22, the division unit 71 outputs, to the drive unit 21, an instruction signal indicating the block positions and the like of the respective regions (first and second regions, first to third regions).

Figure 11:
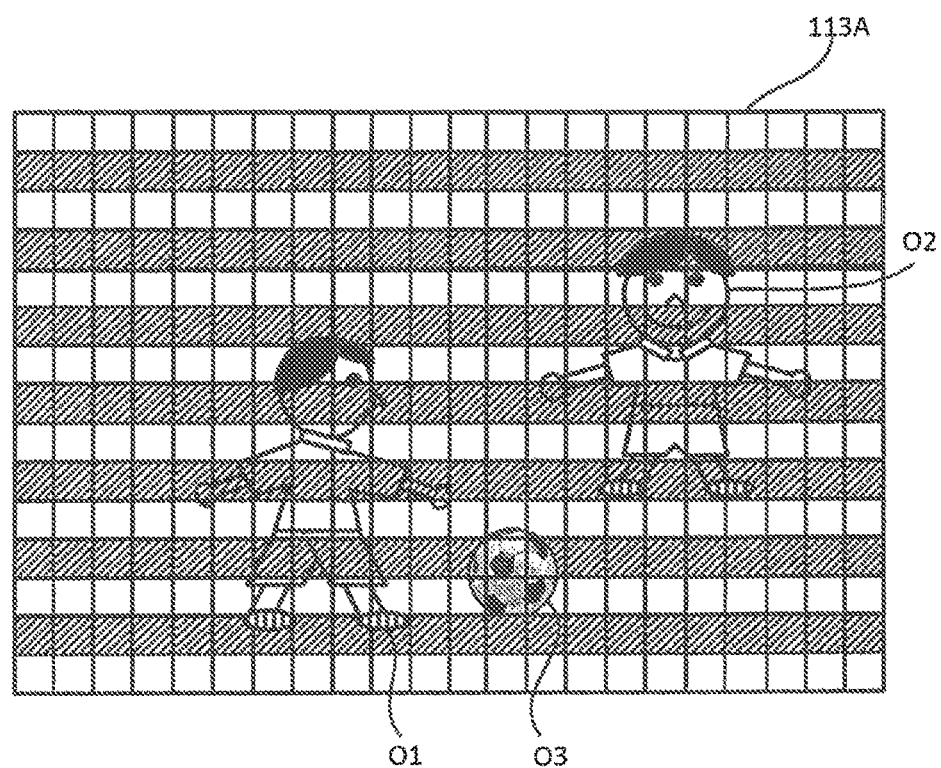
FIG. 11 is a diagram showing an example of the second arrangement pattern set in a second moving image mode.

FIG. 11 is a diagram showing an example of the second block arrangement pattern set in the second moving image mode. Note that in FIG. 11, the blocks are scaled up in order to make it easy to see the block arrangement. In practice, smaller blocks than the blocks shown in FIG. 11 are set in the pixel region 113A. In the example shown in FIG. 11, the detection unit 32A detects persons O1, O2 who are playing soccer and a soccer ball O3, as main subjects (moving subjects). The division unit 71 determines that the main subjects O1 to O3 are moving subjects and are moving mostly horizontally, on the basis of the detection result from the detection unit 32A. As a result, the division unit 71 sets first and second regions in accordance with the second block arrangement pattern shown in FIG. 8(B). At this time, the division unit divides the pixel region 113A in such a manner that the main subjects O1 to O3 are contained in both the first and second regions.

Referring back to FIG. 10, in response to the user touching the ISO sensitivity 522 or frame rate 523, the image capture control unit 72 sets image capture conditions for the regions set in step S22 (the first and second regions in the example shown in FIG. 11) (step S23). Specifically, the division unit 71 outputs, to the drive unit 21, a signal indicating the image capture conditions (gains, frame rates) selected by the user through the touch on the ISO sensitivity 522 or frame rate 523.

The image capture control unit 72 may be configured to, when the gain is changed, automatically set a frame rate value such that optimum exposure is made. The image capture control unit 72 may also be configured to, when the frame rate is changed, automatically set a gain value such that optimum exposure is made. The image capture control unit 72 may also be configured to, when the gain or frame rate is changed, output an instruction signal indicating a parameter (image capture condition), such as color signal processing, white balance adjustment, gradation adjustment, or compressibility, to the image processing unit 30 so that optimum image correction is performed.

If the user sets different frame rates for the first region and second region in step S23, the number of frames recorded per unit time varies between the first recording medium 61 and second recording medium 62. Accordingly, if the first recording medium 61 and second recording medium 62 have the same recording capacity, a difference occurs between the recording time of a first moving image in the first recording medium 61 and the recording time of a second moving image in the second recording medium 62. That is, if the frame rate of the first region is higher than that of the second region, the recording time of the first moving image in the first recording medium 61 is shorter than that of the second moving image in the second recording medium 62.

Figure 12:
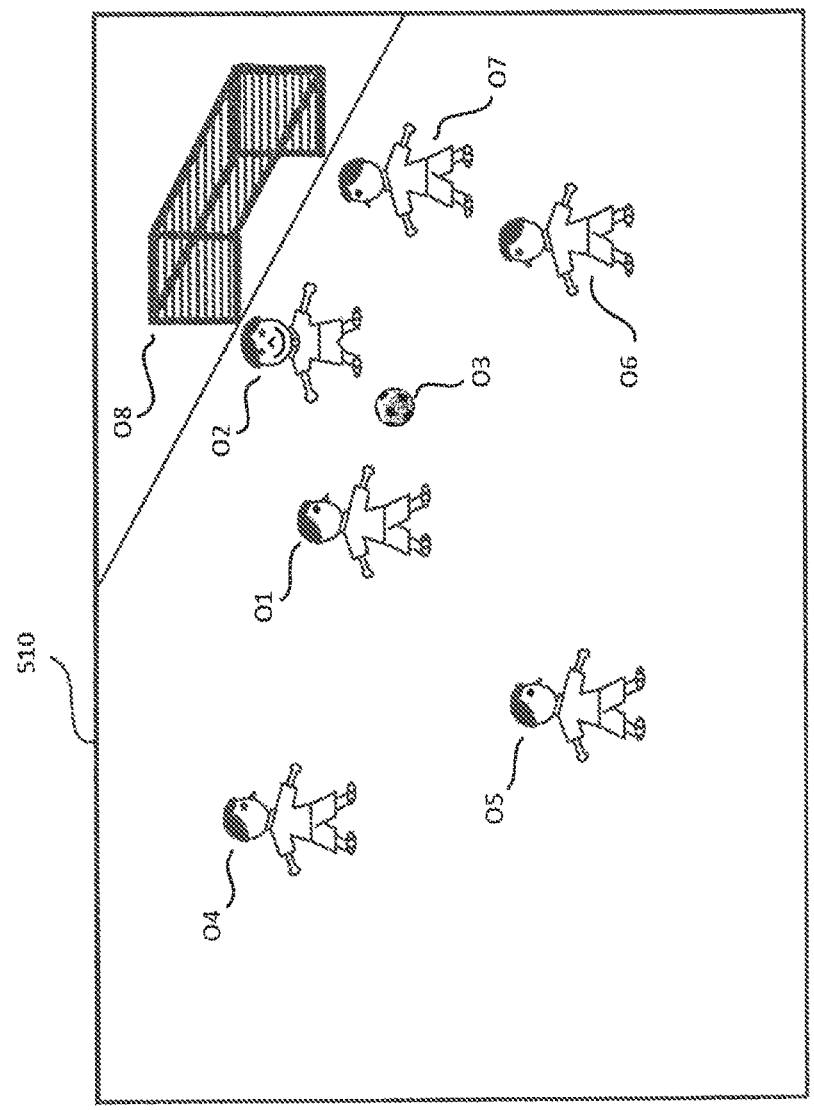
FIG. 12 is a diagram showing an example display of a live view image in an image display region.
Figure 13:
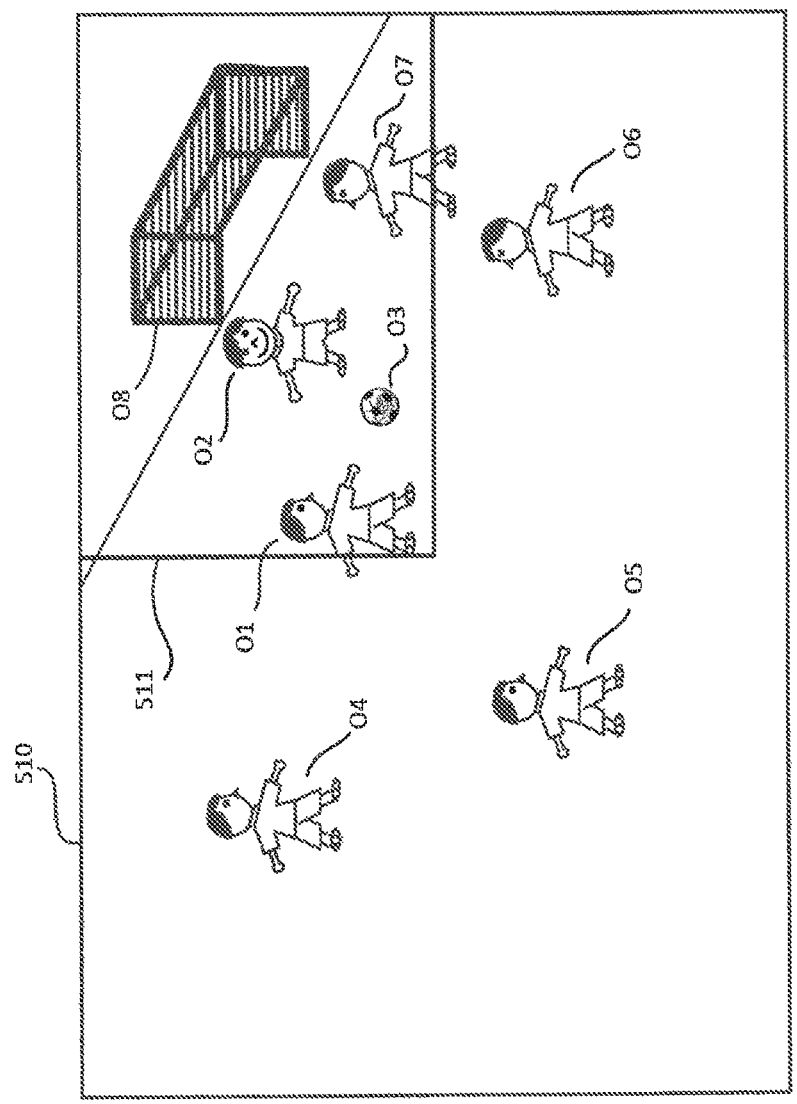
FIG. 13 is a diagram showing the range and position of an electronic zoom in the image display region.
Figure 14:
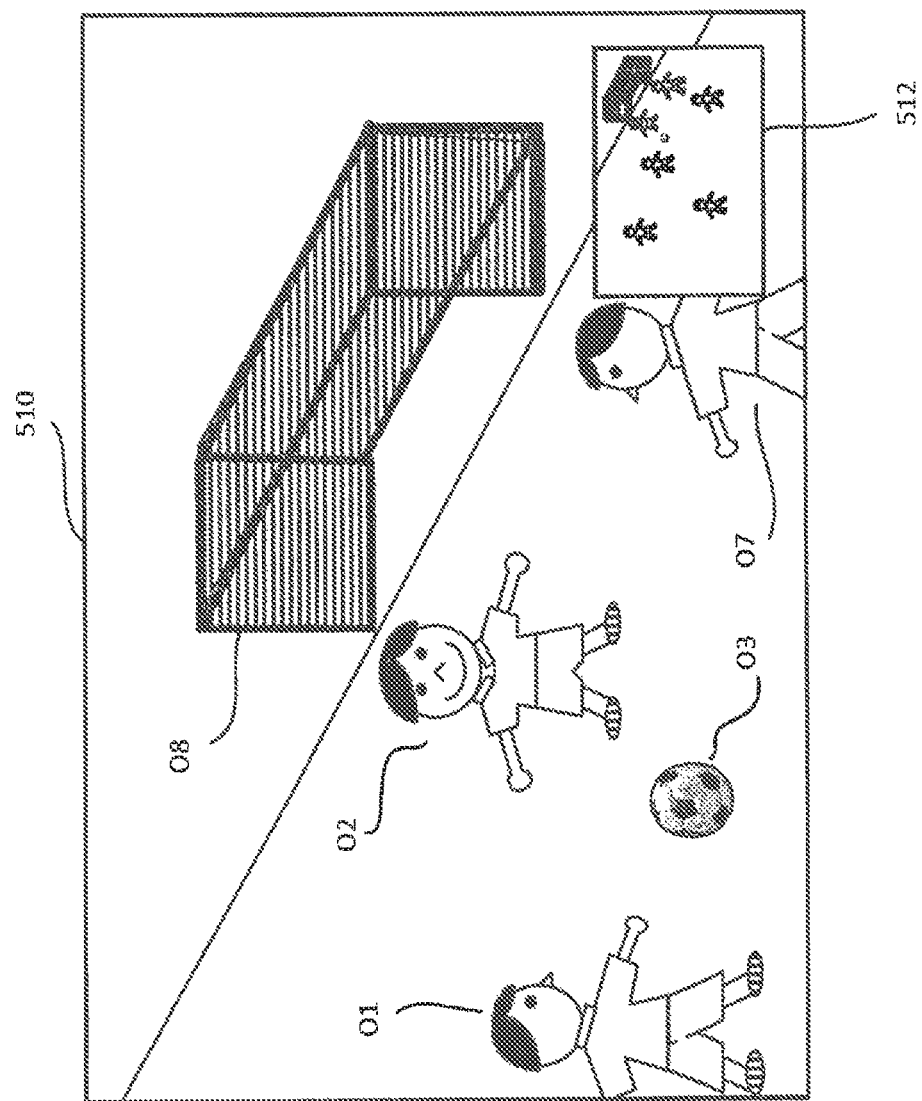
FIG. 14 is a diagram showing the range and position of a sub-screen in the image display region.

Then, in response to the user touching the screen change 524, the display control unit 74 sets (changes) the display screen (step S24). FIG. 12 is a diagram showing an example display of a live view image in the image display region. FIG. 13 is a diagram showing the range and position of the electronic zoom in the image display region. FIG. 14 is a diagram showing the range and position of the sub-screen in the image display region.

In FIG. 12, a live view image (an image in which multiple persons are playing soccer) is being displayed in the image display region 510 with the user not touching the screen change 524 in step S24. This live view image includes multiple persons, O1, O2, O4 to O7, a soccer ball O3, and a goal O8 as main subjects.

If the user selects the electronic zoom by touching the screen change 524 in step S24, the display control unit 74 detects the main subjects O1 to O8 on the basis of the detection result from the detection unit 32A. The display control unit 74 also detects the main human subjects O1, O2, O4 to O7 from the main subjects O1 to O8. Then, as shown in FIG. 13, the display control unit 74 extracts a partial region 511 in which many of the main human subjects O1, O2, O4 to O7 are gathering, from the image display region 510. Then, as shown in FIG. 14, the display control unit 74 displays a live view image of the extracted partial region 511 over the entire image display region 510 in an enlarged manner. At this time, the image capture control unit 72 controls the drive unit 21 so that the drive unit 21 does not capture images in the region (the region whose live view image is not being displayed) other than the partial region 511 in the image display region 510. Thus, it is possible to suppress power consumption when the live view image is being displayed using the electronic zoom in an enlarged manner.

If the user selects the display of the sub-screen (particular region) 512 by touching the screen change 524 in step S24, the display control unit 74 displays the live view image captured in the first region or second region, on the sub-screen 512 shown in FIG. 14. Specifically, when the live view image captured in the first region is being displayed in the image display region 510, the display control unit 74 instructs the image processing unit 30 to combine the live view images captured in the first and second regions so that the live view image captured in the second region is displayed on the sub-screen 512. On the other hand, when the live view image captured in the second is being displayed in the image display region 510, the display control unit 74 instructs the image processing unit 30 to combine the live view images captured in the first and second regions so that the live view image captured in the first region is displayed on the sub-screen 512. The display control unit 74 then outputs the live view image combined by the image processing unit 30 to the display unit 50 so that the live view image is displayed in the image display region 510. In the example shown in FIG. 14, the sub-screen 512 is disposed at the lower-right corner of the image display region 510.

Referring back to FIG. 9, the image capture control unit 72 determines whether the user has operated the moving image switch (step S13). If the image capture control unit 72 determines that the user has operated the moving image switch, it causes the image capture unit 20 to capture images in the moving image mode (first moving image mode or second moving image mode) (step S14). Image capture in the first moving image mode is similar to typical moving image capture and therefore will not be described in detail.

Figure 15:
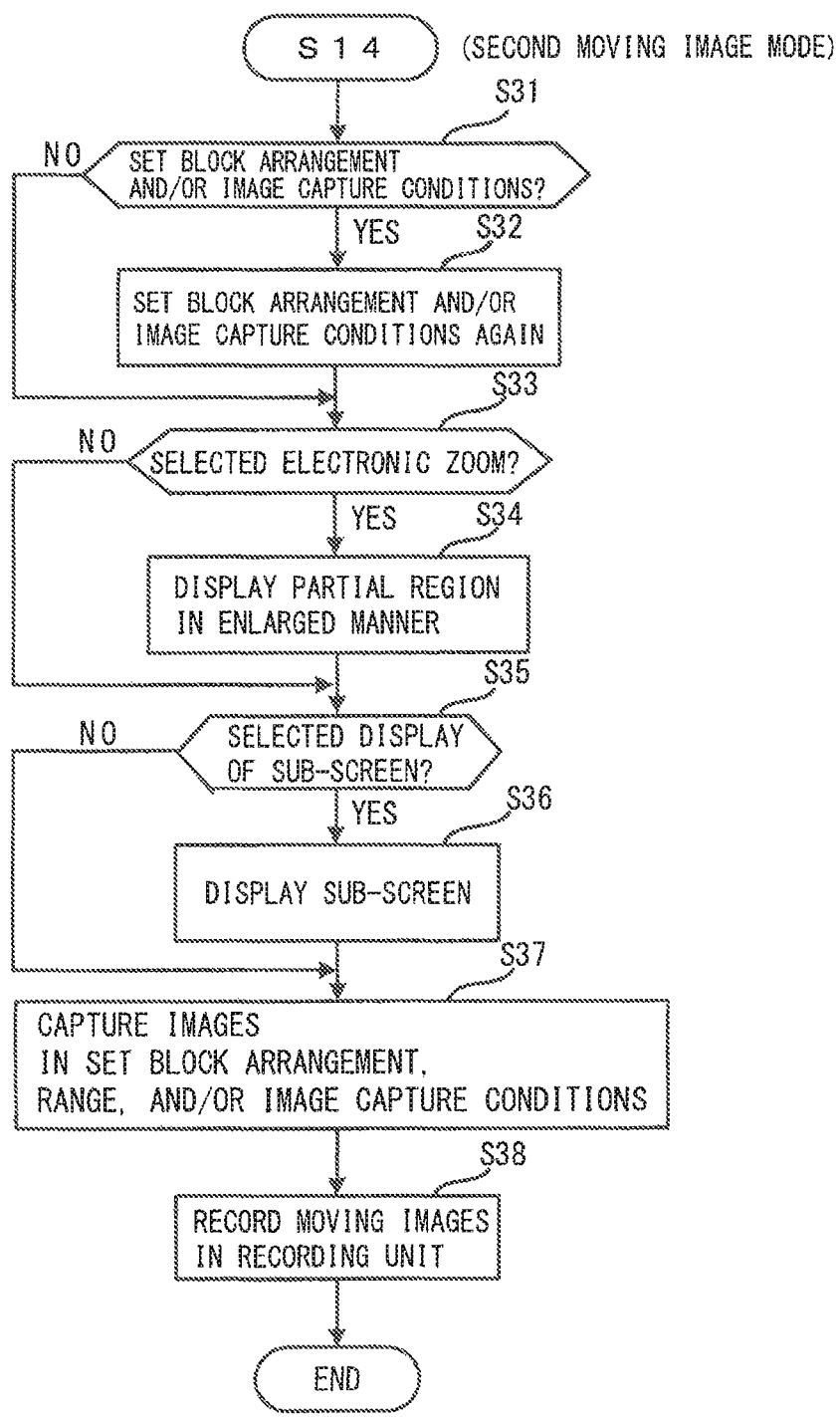
FIG. 15 is a flowchart showing operations in the second moving image mode.

FIG. 15 is a flowchart showing operations in the second moving image mode (step S14). In a process shown in FIG. 15, the division unit 71 determines whether the user has set the block arrangement (i.e., regions) (step S31). The image capture control unit 72 also determines whether the user has set the image capture conditions (step S31). In the present embodiment, the user can set the block arrangement or image capture conditions prior to starting to capture moving images (see steps S22, S23 in FIG. 10), as well as can set the block arrangement or image capture conditions after starting to capture moving images.

For example, the using sets the block arrangement by operating the operation unit 55 and thus selecting one of the block arrangement patterns of FIGS. 8(A) to 8(D) displayed on the display panel 51. For example, the using sets the image capture conditions (gain or frame rate) by touching the ISO sensitivity 522 or frame rate 523, as in step S23 in FIG. 10.

If the division unit 71 determines that the user has set the block arrangement, it sets the block arrangement again (step S32). Specifically, the image capture control unit 72 outputs, to the drive unit 21, an instruction signal indicating the block positions and the like of the respective regions (first and second regions, first to third regions). If the image capture control unit 72 determines that the user has set the image capture condition, it sets the image capture conditions again (step S32). Specifically, the image capture control unit 72 outputs an instruction signal indicating the image capture conditions (gain or frame rate) to the drive unit 21.

The display control unit 74 then determines whether the user has selected the electronic zoom (that is, the user has touched the screen change 524) (step S33). If the display control unit 74 determines that the user has selected the electronic zoom, it displays the partial region 511 over the entire image display region 510 in an enlarged manner, as described with reference to step S24 in FIG. 10 (step S34). The display control unit 74 also determines whether the user has selected the display of the sub-screen 512 (that is, the user has touched the screen change 524) (step S35). If the display control unit 74 determines that the user has selected the display of the sub-screen 512, it displays the sub-screen 512 at the lower-right corner of the image display region 510, as described with reference to step S24 in FIG. 10 (step S36).

Then, the image capture control unit 72 controls the drive of the image sensor 100 so that the image sensor 100 captures images of the subject in the block arrangement set in step S22 or step S32; in the range of the electronic zoom (if the partial region 511 has been displayed in an enlarged manner using the electronic zoom in step S34); and on the image capture conditions set in step S23 or step S32 (step S37). The recording control unit 73 records, in the recording unit 60, image data of the moving images captured by the image sensor 100 and processed by the image processing unit 30 (step S38). Specifically, the recording control unit 73 records, in the first recording medium 61, image data of first moving images captured in the first region and records, in the second recording medium 62, image data of second moving images captured in the second region.

In step S38, the recording control unit 73 outputs, to the image processing unit 30, an instruction signal instructing the image processing unit 30 to interpolate the image data of the moving images captured in the second region into the image data of the first moving images captured in the first region. The recording control unit 73 also outputs, to the image processing unit 30, an instruction signal instructing the image processing unit 30 to interpolate the image data of the moving images captured in the first region into the image data of the second moving images captured in the second region. When the pixel region (image capture region) 113A is divided into two regions (first region, second region), the resolution is reduced to half. On the other hand, by performing the process described above, the image data of defect pixels which occur due to the division of the region is interpolated. Thus, a reduction in resolution can be prevented.

Even when the display control unit 74 is displaying the moving images captured in the partial region 511 of the first region over the entire image display region 510 in an enlarged manner using the electronic zoom (step S34), the recording control unit 73, in step S38, records, in the second recording medium 62, the second moving images captured in the second region and records, in the first recording medium 61, the moving images captured in the partial region 511 of the first region. According to this configuration, it is possible to record not only the moving images of the partial region 511 being displayed over the entire image display region 510 in an enlarged manner but also the moving images which are not being displayed in the image display region 510.

When the display control unit 74 is displaying one of the moving image captured in the partial region 511 of the first region and the second moving image over the entire image display region 510 and is displaying the other moving image on the sub-screen 512 (step S37), the recording control unit 73, in step S38, records a moving image in which the one moving image and the other moving image are combined (see FIG. 14), in the recording unit 60. According to this configuration, it is possible to record moving images captured at different angles of view (a moving image captured in the range of the electronic zoom and a moving image captured in the entire image display region 510), as a single moving image. At this time, if the one moving image and the other moving image have different frame rates, the image processing unit 30 thins out the frames or adds frames so that the frame rates are equalized. Thus, it is possible to record the moving images captured at different angles of view as a single moving image in the first recording medium 61 or second recording medium 62.

Figure 16:
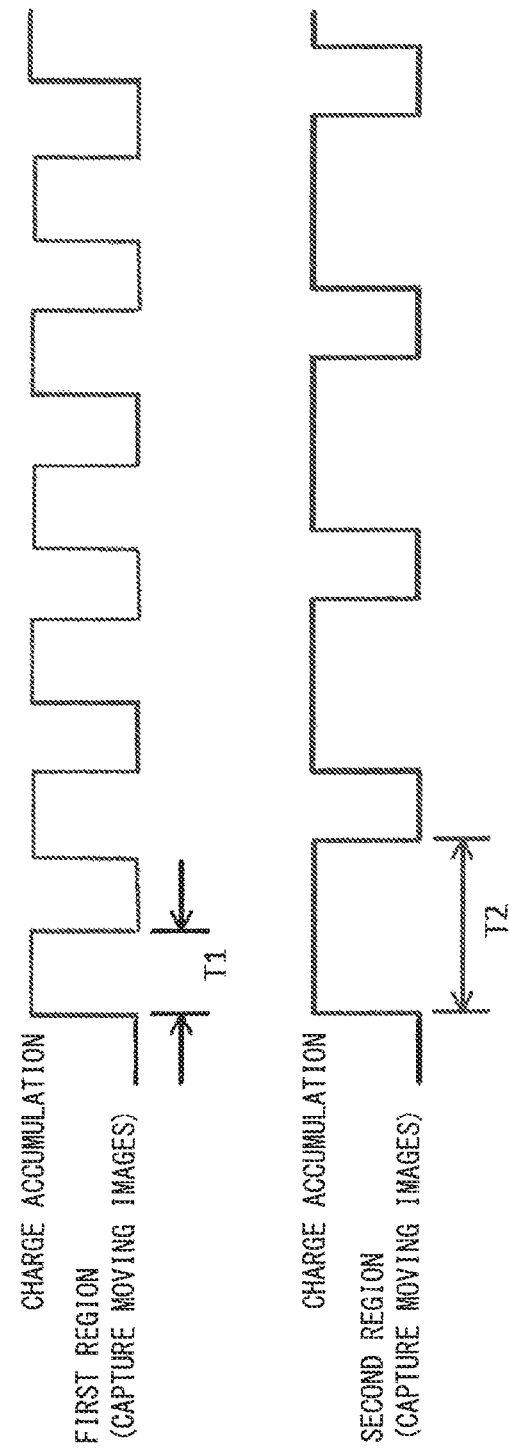
FIG. 16 is a timing chart showing charge accumulation timings in the second moving image mode.

FIG. 16 is a timing chart showing charge accumulation timings in the second moving image mode (image capture in step S37). In FIG. 16, for example, first and second regions are set in the second moving image mode. While the user operates the moving image switch in the second moving image mode, the image capture control unit 72 outputs, to the drive unit 21, an instruction signal instructing the drive unit 21 to capture moving images in the first region, as well as to capture moving images in the second region. In FIG. 16, while the user operates the moving image switch, the drive unit 21 causes the image sensor 100 to capture moving images by accumulating charge in the pixels of the first region for a charge accumulation time T1. Also, while the user operates the moving image switch, the drive unit 21 causes the image sensor 100 to capture moving images by accumulating charge in the pixels of the second region for a charge accumulation time T2 which is longer than the charge accumulation time T1. The frame rate varies with the charge accumulation time. Accordingly, the frame rate of moving images varies between when images are captured for the charge accumulation time T1 and when images are captured for the charge accumulation time T2. For example, the frame rate corresponding to the charge accumulation time T1 of the first region is 60 fps, and the frame rate corresponding to the charge accumulation time T2 of the second region is 30 fps. The charge accumulation time or frame rate is set in the image capture condition setting process in step S23 or step S32.

The pixel signals read from the pixels in the first region of the image sensor 100 are amplified by the amplifier 412 using the gain indicated by the image capture control unit 72 and then outputted to the image processing unit 30. The image generation unit 31A identifies parameters used in image processing, such as color signal processing, on the basis of an instruction signal outputted from the image capture control unit 72 and indicating the image capture conditions of the first region. The image generation unit 31A then generates first-region image data by performing various types of image processing on RAW data composed of the pixel signals from the pixels in the first region on the basis of the parameters.

The pixel signals read from the pixels in the second region of the image sensor 100 are amplified by the amplifier 412 using the gain indicated by the image capture control unit 72 and then outputted to the image processing unit 30. The image generation unit 31B identifies parameters used in image processing, such as color signal processing, on the basis of an instruction signal outputted from the image capture control unit 72 and indicating the image capture conditions of the second region. The image generation unit 31B then generates second-region image data by performing various types of image processing on RAW data composed of the pixel signals from the pixels in the second region on the basis of the parameters.

Since the frame rate of the first region is higher than that of the second region as described above, the main human subjects in the first moving images move more smoothly than the main human subjects in the second region.

As described above, the electronic apparatus 1 of the first embodiment includes the image capture unit 20, which includes the image sensor 100, the division unit 71, which divides the pixel region 113A of the image sensor 100 into at least first and second regions, the image capture control unit 72, which sets different image capture conditions for the first and second regions, and the moving image generation unit 31, which generates a first moving image from an image captured in the first region and generates a second moving image from an image captured in the second region. According to this configuration, it is possible to generate multiple types of moving images corresponding to multiple regions for which different image capture conditions are set. Thus, multiple types of moving images can be generated in accordance with the subject or image capture situation. That is, the electronic apparatus 1 including the image sensor 100 provides improved usability.

The moving image generation unit generates a first moving image from an image of the same subject captured in the first region and generates a second moving image from an image of the same subject captured in the second region. Thus, it is possible to generate multiple types of moving images of the same subject. The division unit 71 equalizes the number of the pixels in the first region and the number of the pixels in the second region, that is, the division unit 71 uniformly disposes the blocks in the first region and second region of the image display region 510. Thus, variations in the resolution in the image display region 510 are prevented. The division unit 71 forms a first region from multiple discrete regions (multiple discrete blocks). This prevents the resolution of moving images from decreasing locally. The division unit 71 variably divides the pixel region into first and second regions. Thus, the pixel region can be divided into regions corresponding to various situations, such as the type of the subject.

The image capture control unit 72 sets at least different frame rates for the first region and second region of the image sensor 100, as image capture conditions. Thus, the user can obtain multiple types of moving images captured on the different image capture conditions. The moving image generation unit 31 corrects first and second moving images using at least one of different white balances, different gradations, and different tone corrections. Thus, the user can obtain multiple types of moving images processed on the basis of different parameters.

The moving image generation unit 31 interpolates the moving image captured in the second region into the first moving image and interpolates the moving image captured in the first region into the second moving image. According to this configuration, the image data of defect pixels which occur due to the division of the pixel region 113A is interpolated, thereby preventing a reduction in resolution. The electronic apparatus 1 includes the recording control unit 73, which records the first and second moving images generated by the moving image generation unit 31 in the recording unit 60. Thus, the simultaneously generated two types of moving images can be recorded.

The electronic apparatus 1 includes the display control unit 74, which displays moving images generated by the image generation unit 31 on the display unit 50. Thus, the user can check the moving images displayed on the display unit 50. The display control unit 74 displays the moving image captured in the partial region 511 of the first region on the display unit 50 in an enlarged manner, and the recording control unit 73 records the second moving image and the moving image captured in the partial region 511, in the recording unit 60. According to this configuration, it is possible to record not only the moving images of the partial region 511 being displayed over the entire region of the display unit 50 (the entire image display region 510) in an enlarged manner but also moving images in the entire image display region 510 which are not being displayed.

The display control unit 74 displays one of the moving image captured in the partial region 511 of the first region and the second moving image on the display unit 50, as well as displays the other moving image in the particular region (sub-screen 512) of the display unit 50. The recording control unit 73 records a moving image in which the one moving image and the other moving image are combined (see FIG. 14), in the recording unit 60. According to this configuration, it is possible to record moving images captured at different angles of view, as a single moving image.

The detection unit 32A detects main subjects from moving images generated by the moving image generation unit 31, and the division unit 71 divides the pixel region into first and second regions in such a manner that the main subjects are contained in both the first and second regions. Thus, it is possible to generate a first moving image of the main subjects in the first region and to generate a second moving image of the main subjects in the second region. The image sensor 100 has a structure in which a back-illuminated image capture chip and a signal processing chip are stacked. Thus, the volume required to contain the image sensor 100 can be reduced. The drive of the image sensor 100 is controlled on the basis of an instruction from the system control unit 70. Thus, the load of the system control unit 70 can be reduced, and the image sensor 100 can be easily mounted on the electronic apparatus 1.

While the electronic apparatus 1 according to the first embodiment shown in FIG. 5 includes the display unit 50, the display unit 50 may be disposed outside the electronic apparatus. In this case, the system control unit 70 and display unit 50 are each provided with a communication unit that receives and transmits signals (image data, control signals, and the like) by wire or wirelessly. The image processing unit 30 and system control unit 70 may be formed integrally with each other. In this case, the respective functions of the image processing unit 30 and system control unit 70 are implemented when a system control unit including one or more CPUs performs processing on the basis of a control program. While the image processing unit 30 includes the two image processing units, 30A and 30B, it may include only one image processing unit.

Second Embodiment

A configuration of a second embodiment is obtained by dividing the electronic apparatus 1 of the first embodiment into an image capture device 1A and an electronic apparatus 1B.

Figure 17:
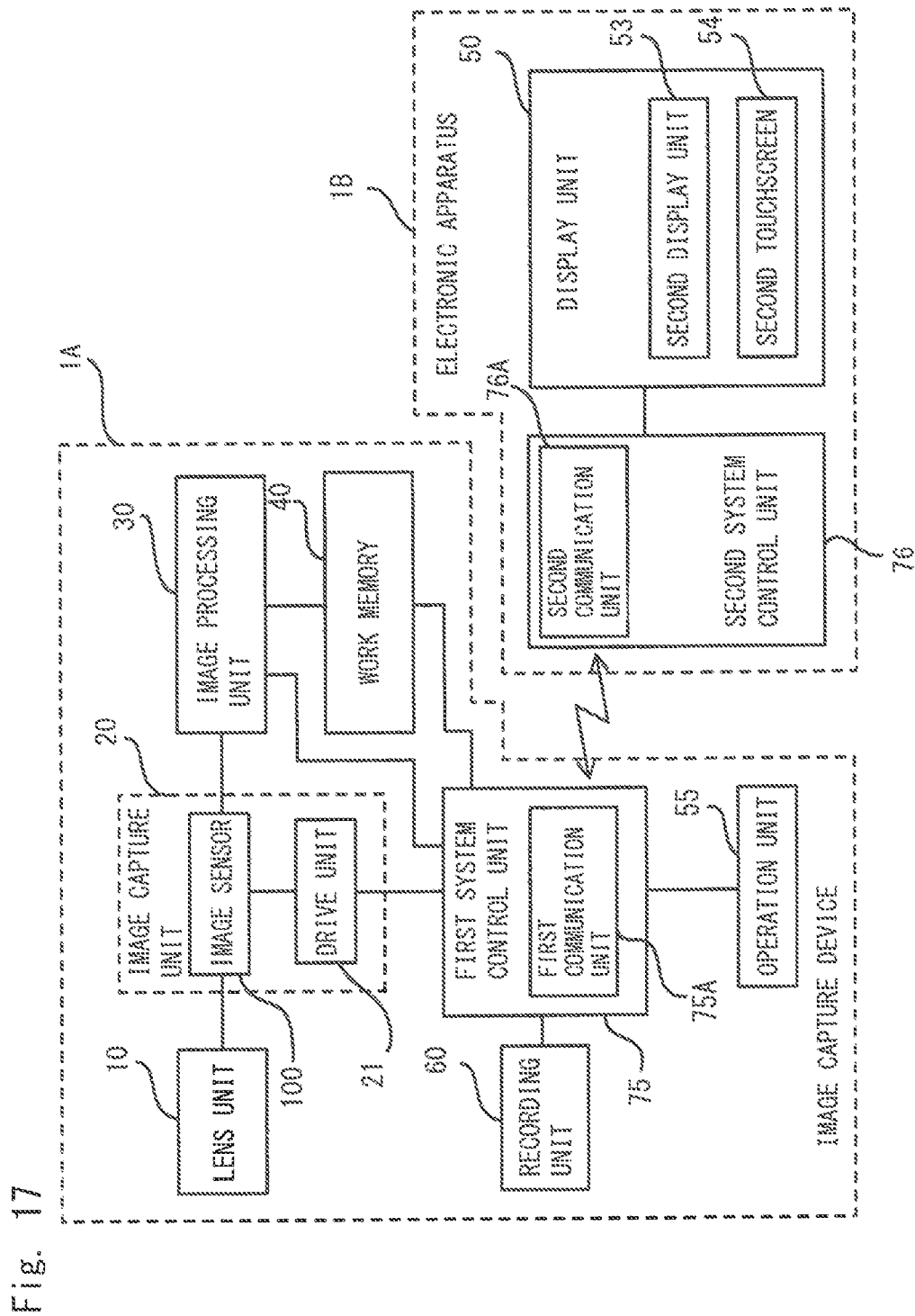
FIG. 17 is a block diagram showing the configuration of an image capture device and an electronic apparatus according to a second embodiment.

FIG. 17 is a block diagram showing the configuration of the imaging capture device and electronic apparatus according to the third embodiment. In the configuration shown in FIG. 17, the image capture device 1A captures images of subjects. The image capture device 1A includes a lens unit 10, an image capture unit 20, an image processing unit 30, a work memory 40, an operation unit 55, a recording unit 60, and a first system control unit 75. The 10, image capture unit 20, image processing unit 30, work memory 40, operation unit 55, and recording unit 60 of the image capture device 1A are similar to those shown in FIG. 5. Accordingly, the same elements are given the same reference signs and will not be described repeatedly.

The electronic apparatus 1B displays images (still images, moving images, live view images). The electronic apparatus 1B includes a display unit 50 and a second system control unit (control unit) 76. The display unit 50 of the electronic apparatus 1B has a configuration similar to that shown in FIG. 5. Accordingly, the same elements are given the same reference signs and will not be described repeatedly.

The first system control unit 75 includes a first communication unit 75A. The second system control unit 76 includes a second communication unit 76A. The first communication unit 75A and second communication unit 76A transmit and receive signals to and from each other by wire or wirelessly. The first system control unit 75 includes, for example, elements equivalent to the division unit 71, image capture control unit 72, and recording control unit 73 of the elements shown in FIG. 7. The second system control unit 76 includes, for example, only an element equivalent to the display control unit 74 of the elements shown in FIG. 7.

The elements shown in FIG. 7 (division unit 71, recording control unit 73, and display control unit 74) may be disposed in any of the first system control unit 75 and second system control unit 76. Specifically, all the elements shown in FIG. 7 may be disposed in one of the first system control unit 75 and second system control unit 76, or some of the elements shown in FIG. 7 may be disposed in the first system control unit 75, and the other elements may be disposed in the second system control unit 76.

Examples of the image capture device 1A include digital cameras, smartphones, mobile phones, and personal computers which each have image capture and communication functions. Examples of the electronic apparatus 1B include smartphones, mobile phones, and portable personal computers which each have a communication function.

The first system control unit 75 shown in FIG. 17 is implemented when a CPU (not shown) performs processing on the basis of a control program. The second system control unit 76 shown in FIG. 17 is implemented when a CPU (not shown) performs processing on the basis of a control program.

In the configuration shown in FIG. 17, the image processing unit 30 and first system control unit 75 may be formed integrally with each other. In this case, the functions of the image processing unit 30 and first system control unit 75 are implemented when a system control unit including one or more CPUs performs processing on the basis of a control program.

While the present invention has been described using the embodiments, the technical scope of the invention is not limited to the scope described in the embodiments. Various changes or modifications can be made to the embodiments without departing from the spirit and scope of the invention. Further, one or more of the elements described in the embodiments may be omitted. Any forms resulting from such changes, modifications, or omission fall within the technical scope of the invention. Elements of the embodiments or modifications thereof may be combined as appropriate and used.

The block arrangement patterns in FIGS. 8(A) to 8(C) are set such that the first and second regions have the same area. Specifically, these block arrangement patterns are set such that the first and second regions have the same number of pixels. The block arrangement pattern in FIG. 8(D) is set such that the first to third regions have the same area. Specifically, this block arrangement pattern is set such that the first to third regions have the same number of pixels. However, a block arrangement pattern may be set such that respective regions have different areas (the different numbers of pixels).

While the color filters 102 form a Bayer array in the embodiments, they may form other types of arrays. Each unit group 131 only has to include at least one pixel. Each block also only has to include at least one pixel. Accordingly, it is also possible to capture images on image capture conditions which vary among the pixels.

In the embodiments, part or all of the drive unit 21 may be included in the image capture chip 113 or signal processing chip 111. Part of the image processing unit 30 may also be included in the image capture chip 113 or signal processing chip 111. Part of the system control unit 70 may also be included in the image capture chip 113 or signal processing chip 111.

While both the gain and frame rate are changeable as image capture conditions in the first embodiment, at least one of these only has to be changeable. While only the case in which the image capture conditions are set in response to an operation of the user has been described, the image capture conditions may be set automatically in accordance with the main subjects or the like.

While the block arrangement patterns of the embodiments are exemplified in FIGS. 8(A) to 8(D), other block arrangement patterns may be employed. While the case in which the sizes of the block regions are previously set has been described in the embodiments, the user may set the sizes of the block regions.

In the first embodiment, the division unit 71 recognizes subjects on the basis of live view images and then sets regions. Alternatively, the division unit 71 may recognize subjects on the basis of an image with respect to which the user has just pressed the release switch or moving image switch halfway and then may set regions.

DESCRIPTION OF REFERENCE SIGNS

1, 1B . . . electronic apparatus, 1A . . . image capture device, 20 . . . image capture unit, 30 . . . image processing unit, 31 . . . image generation unit (moving image generation unit), 32A . . . detection unit, 50 . . . display unit, 51 . . . display panel, 52 . . . touchscreen, 53 . . . second display unit, 54 . . . second touchscreen, 70 . . . system control unit, 70A . . . first system control unit, 76 . . . second system control unit, 71 . . . division unit, 72 . . . image capture control unit, 73 . . . recording control unit, 74 . . . display control unit, 100 . . . image sensor

The invention claimed is:

1. An electronic apparatus comprising:
an image sensor that includes:
multiple pixels arranged side by side in a row direction;
a first control line (i) that is connected to first pixels, each of which includes a first photoelectric converter that converts light into an electric charge, among the multiple pixels and (ii) that outputs a first control signal for controlling the first pixels;
a second control line (i) that is connected to second pixels, each of which includes a second photoelectric converter that converts light into an electric charge, among the multiple pixels and (ii) that outputs a second control signal for controlling the second pixels; and
a display that displays a first image generated based on first signals output from the first pixels and a second image generated based on second signals output from the second pixels.

2. The electronic apparatus according to claim 1, wherein the second control signal is output to the second control line at a timing different from the timing at which the first control signal is output to the first control line.

3. The electronic apparatus according to claim 1, wherein each of the first pixels includes a first transfer that is connected to the first control line and transfers the charge of the first photoelectric converter, and each of the second pixels has a second transfer that is connected to the second control line and transfers the charge of the second photoelectric converter.

4. The electronic apparatus according to claim 3, wherein the second control signal is output to the second control line at a timing different from the timing at which the first control signal is output to the first control line.

5. The electronic apparatus according to claim 3, wherein the image sensor includes a third control line connected to the first pixels to output a third control signal for controlling the first pixels, and the image sensor includes a fourth control line connected to the second pixels to output a fourth control signal for controlling the second pixels;
each of the first pixels includes a first reset unit that is connected to the third control line and resets the potential of a first floating diffusion to which the charge of the first photoelectric converter is transferred by the first transfer; and
each of the second pixels includes a second reset unit that is connected to the fourth control line and resets the potential of a second floating diffusion to which the charge of the second photoelectric converter is transferred by the second transfer.

6. The electronic apparatus according to claim 5, wherein the second control signal is output to the second control line at a timing different from the timing at which the first control signal is output to the first control line; and the fourth control signal is output to the fourth control line at a timing different from the timing at which the third control signal is output to the third control line.

7. The electronic apparatus according to claim 1, wherein each of the first pixels includes a first reset unit that is connected to the first control line and resets the potential of a first floating diffusion to which the charge of the first photoelectric converter is transferred; and each of the second pixels includes a second reset unit that is connected to the second control line and resets the potential of a second floating diffusion to which the charge of the second photoelectric converter is transferred.

8. The electronic apparatus according to claim 7, wherein the second control signal is output to the second control line at a timing different from the timing at which the first control signal is output to the first control line.

9. The electronic apparatus according to claim 1, wherein the image sensor includes a first signal processor that performs signal processing on the first signals output to a first output line and a second signal processor that performs signal processing on the second signals output to a second output line; and the display displays the first image generated based on the first signals processed by the first signal processor and the second image generated based on the second signals processed by the second signal processor.

10. The electronic apparatus according to claim 9, wherein
the image sensor includes:
an imaging chip in which the first photoelectric converters and the second photoelectric converters are arranged; and
a signal processing chip in which at least a part of a circuit of the first signal processor and at least a part of a circuit of the second signal processor are arranged.

11. The electronic apparatus according to claim 10, wherein the imaging chip is stacked on the signal processing chip.

12. The electronic apparatus according to claim 9, wherein
the first signal processor includes at least a part of a circuit of a first amplifier that amplifies the first signals with a first amplification factor;
the second signal processor includes at least a part of a circuit of a second amplifier that amplifies the second signals with a second amplification factor different from the first amplification factor; and
the display displays the first image based on the first signals amplified by the first amplifier and the second image based on the second signals amplified by the second amplifier.

13. The electronic apparatus according to claim 12, wherein
the first signal processor includes at least a part of a circuit of a first converter that converts the first signals amplified by the first amplifier into digital signals;
the second signal processor includes at least a part of a circuit of a second converter that converts the second signals amplified by the second amplifier into digital signals; and
the display displays the first image based on the first signals converted into digital signals by the first converter and the second image based on the second signals converted into digital signals by the second converter.

14. The electronic apparatus according to claim 12, wherein
the image sensor includes:
an imaging chip in which the first photoelectric converters and the second photoelectric converters are arranged; and
a signal processing chip in which at least a part of a circuit of the first amplifier and at least a part of a circuit of the second amplifier are arranged.

15. The electronic apparatus according to claim 14, wherein the imaging chip is stacked on the signal processing chip.

16. The electronic apparatus according to claim 9, wherein
the first signal processor includes at least a part of a circuit of a first converter that converts the first signals output to the first output line into digital signals;
the second signal processor includes at least a part of a circuit of a second converter that converts the second signals output to the second output line into digital signals; and
the display displays the first image based on the first signals converted into digital signals by the first converter and the second image based on the second signals converted into digital signals by the second converter.

17. The electronic apparatus according to claim 16, wherein
the image sensor includes:
an imaging chip in which the first photoelectric converters and the second photoelectric converters are arranged; and
a signal processing chip in which at least a part of a circuit of the first converter and at least a part of a circuit of the second converter are arranged.

18. The electronic apparatus according to claim 17, wherein the imaging chip is stacked on the signal processing chip.

* * * * *